US008283553B1

(12) United States Patent
Yap et al.

(10) Patent No.: US 8,283,553 B1
(45) Date of Patent: Oct. 9, 2012

(54) PHOTON ENHANCED THERMOELECTRIC POWER GENERATION

(75) Inventors: Daniel Yap, Newbury Park, CA (US); David S. Sumida, Los Angeles, CA (US)

(73) Assignee: HRL Laboratories, LLC, Malibu, CA (US)

( * ) Notice: Subject to any disclaimer, the term of this patent is extended or adjusted under 35 U.S.C. 154(b) by 502 days.

(21) Appl. No.: 12/235,401

(22) Filed: Sep. 22, 2008

Related U.S. Application Data

(60) Provisional application No. 60/974,400, filed on Sep. 21, 2007.

(51) Int. Cl.
*H01L 35/30* (2006.01)
(52) U.S. Cl. .................... 136/206; 136/204; 136/201
(58) Field of Classification Search ........... 136/200–212
See application file for complete search history.

(56) References Cited

U.S. PATENT DOCUMENTS

| | | | | |
|---|---|---|---|---|
| 5,777,349 | A  * | 7/1998 | Nakamura et al. | 257/94 |
| 6,762,484 | B2 | 7/2004 | Span | |
| 7,638,705 | B2 * | 12/2009 | Venkatasubramanian | 136/206 |
| 2007/0235134 | A1 * | 10/2007 | Iimuro | 156/345.27 |
| 2008/0053514 | A1 * | 3/2008 | Micallef | 136/248 |
| 2008/0087323 | A1 * | 4/2008 | Araki et al. | 136/256 |
| 2009/0272424 | A1 * | 11/2009 | Ortabasi | 136/246 |
| 2010/0236595 | A1 * | 9/2010 | Bell et al. | 136/205 |

OTHER PUBLICATIONS

Bell, L.E., et al., "Alternate thermoelectric thermodynamic cycles with improved power generation efficiencies," Proceedings 22nd International Conference on Thermoelectrics, 562, pp. 558-562 (2003).

Hendricks, T.J., et al., "Advanced Thermoelectric Power System Investigations for Light Duty and Heavy duty Applications: Part 1," Proceedings of the 21st International Conference on Thermoelectrics, IEEE Catalogue #02TH8657, pp. 381-386 (2002).

Kucherov, Y., et al., "Importance of barrier layers in thermal diodes for energy conversion," Journal of applied physics, vol. 97, p. 094902 (2005).

(Continued)

*Primary Examiner* — Jennifer Michener
*Assistant Examiner* — Jayne Mershon
(74) *Attorney, Agent, or Firm* — Ladas & Parry

(57) ABSTRACT

A system and method for generating electrical power from a heat source utilizing both photonic and thermal conversion are disclosed. Specifically, power is generated by coupling photon converters to thermoelectric pairs in a way such that the thermoelectric pairs gain not only the charge carriers (holes and electrons) generated by the photons absorbed by the photon converters, but also the charge carriers generated by excess heat in the photon converters and an added thermal gradient generated by excess energy in the absorbed photons. Heat exchanger variations for such a system are also disclosed. Specifically, heat exchangers with and without photon emitters are disclosed and variants of refractive indices for heat exchanger systems are disclosed.

18 Claims, 10 Drawing Sheets

OTHER PUBLICATIONS

Matsubara, K., "Development of a high efficient thermoelectric stack for a waste exhaust heat recovery of vehicles," Proceedings 21st International Conference on Thermoelectrics, pp. 418-423 (2002).

Pan, J.L., et al., "Very large radiative transfer over small distances from a black body for thermophotovoltaic applications," IEEE Transactions on Electron Devices, vol. 47, No. 1, pp. 241-249 (Jan. 2000).

Shakouri, A., "Thermoelectric, thermionic, and thermophotovoltaic energy conversion," Proceedings of the 2005 International Conference on Thermoelectrics (2005).

Span, G., et al., "Thermoelectric power generation using large area pn-junctions," Proceedings of 2005 European Conference on Thermoelectrics (2005).

Wagner, M., et al., "Thermoelectric power generation using large area Si/SiGe pn-junctions with varying Ge-content," Proceedings of 2006 International Conference on Thermoelectrics (2006).

Zenker, et al., "Efficiency and power density potential of combustion-driven thermophotovoltaic systems using GaSb photovoltaic cells," IEEE Transactions on Electron Devices, vol., vol. 48, No. 2, pp. 367-376 (Feb. 2001).

* cited by examiner

PHOTON ENHANCED THERMOELECTRIC POWER GENERATION

CROSS REFERENCE TO RELATED APPLICATIONS

This application claims benefit to U.S. provisional application 60/974,400 filed on Sep. 21, 2007, for "Photon Enhanced Thermoelectric Power Generation" by Daniel Yap, et al., the disclosure of which is incorporated herein by reference.

BACKGROUND

1. Field

This disclosure relates to the field of deriving electrical power from a heat source. More specifically, this disclosure relates to extracting both thermal and photonic energy from a heat source, especially from a thermal flow.

2. Description of the Related Art

A common thermoelectric (TE) generator is illustrated in FIG. 1. TE generators convert heat into electric current or voltage. Holes and electrons are produced in the P-type and the N-type TE elements, respectively, as a result of thermal excitation and, preferably, doping of the constituent materials. The TE elements have one end (the hot end) contacting a heat exchanger that is at a high temperature and have an opposite end (the cold end) contacting a heat exchanger or heat sink that is at a cold temperature. The gradient in temperature that is established in the TE elements results in a net flow of electrical carriers from the hot end to the cold end, or the establishment of an electrical potential to oppose such a current flow, because of a thermoelectric effect (e.g., the Seebeck effect).

The TE elements are typically arranged in pairs, or TE couples, that comprise a P-type element and an N-type element. The hot ends of these two elements are joined together by electrical contacts to a common metal interconnect. These contacts serve as a source of the majority carriers (holes in the P-type element and electrons in the N-type element) that carry the net thermoelectric current. On their cold ends, the P-type element and the N-type element of a given TE couple are electrically connected to each other only through an external circuit. Higher thermoelectric voltage may be obtained by electrically connecting multiple TE couples in series, as illustrated in FIG. 1. Higher thermoelectric current may be obtained by electrically connecting multiple TE couples in parallel.

The size of that electrical current depends on both the temperature gradient and on the Seebeck coefficient and the electrical conductivity of the materials comprising the TE element. The temperature gradient, $-VT$, also can result in a heat flow (thermal current) that depends on the thermal conductivity of the materials. For highest TE efficiency, this heat flow is not desirable since it can reduce the strength of the temperature gradient. Thus, preferred TE materials have high electrical conductivity s, a large Seebeck coefficient S and low thermal conductivity b. These relationships are described in the equations below:

Electrical current: $J(r) = s(F - (1/q)VE_f) + sS(-VT)$

Heat flow: $JQ(r) = sST(F - (1/q)VE_f) + b(-VT)$ where $(1/q)VE_f$ is the additional carrier injection and $sS(-VT)$ is the thermoelectric effect. The heat flow through a TE element provided by the thermal conductivity of that TE element is described by $b(-VT)$. Note that additional electrical current through a TE element can result from a local electrical field F existing between the hot and cold ends of that element and also from a gradient in the density of electrical carriers, $-(1/q)VE_f$, existing between the hot and cold ends of that element.

There are some alternative generators of electrical power that make use of the temperature difference between a hot end and a cold end. One such prior art generator is described in an article by G. Span, et al. ("Thermoelectric power generation using large area pn-junctions", Proceedings of 2005 European Conference on Thermoelectrics, 2005) and in a patent issued to G. Span (U.S. Pat. No. 6,762,484 B2). This generator comprises a P-type layer and an N-type layer that are electrically in contact and that form a PN junction. One end of the PN junction is at a hot temperature and an opposite end of the PN junction is at a cold temperature. The PN junction is formed over the entire length of the P-type and N-type layers. Carriers (electrons and holes) are thermally generated in the depletion region of the PN junction. The built-in potential of the PN junction separates the electron and holes, injecting the electrons into the N-type layer and the holes into the P-type layer.

Overall, there is net generation at the hot side and net recombination of carriers at the cold side. Thus, there is a net flow of injected carriers from the hot side to the cold side. In general, the P-layer and the N-layer of this prior generator both are made from the same material type (e.g., both comprising Si or both comprising SiGe), although those layers have different doping (e.g., p-doped and n-doped, respectively). However, the composition of that material (of both the P-layer and the N-layer) may vary along the length of the PN junction from the hot side to the cold side. For example, the material of both the P-type and the N-type layers can change from being Si at the hot side to being SiGe at the cold side. Use of varying composition material is described in a paper by M. Wagner, et al., "Thermoelectric power generation using large-area Si/SiGe pn-junctions with varying Ge-content," *Proceedings of* 2006 *International Conference on Thermoelectrics* (2006).

These prior art generators contain PN homojunctions in which the P-layer and the N-layer are made from the same material type. In contrast, the presently disclosed enhanced power generation system contains heterojunctions in which the P-type element, the N-type element and a carrier generating photon converter preferably are made from different material types. In further contrast with the prior PN junction generator, for which the PN junction extends fully from the hot-side to the cold-side, the carrier generating photon converter presently disclosed is located primarily at the hot end and preferably does not extend to the cold end.

Another type of prior art generator is described in a paper by Y. Kucherov, P. Hagelstein, et al., (Importance of barrier layers in thermal diodes for energy conversion," *Journal of Applied Physics*, v. 97, p. 094902, 2005). This prior generator contains a heavily doped N-type emitter located at the hot end of the device. The emitter thermally generates electrical charge carriers (e.g., electrons) and injects those carriers into the solid gap region, which comprises a more lightly doped N-type material. A P-type electronic energy barrier (separation layer) prevents carriers that are thermally generated in the gap region from being injected back into the emitter. Thus, there is net flow of the carriers from the hot side to the cold side. Although there may be some carrier flow from the hot end of the gap region to the cold end of the gap region because of the temperature gradient along that gap region, much of the net carrier flow is produced because of the carrier injection from the emitter. In general, the emitter, barrier and gap region are made from the same material type (e.g., all made from InSb or all made from HgCdTe) although these regions have different doping.

These prior art generators involve thermal generation of electrical carriers outside a TE region and injection of those carriers, as majority carriers, into the TE region. In contrast, the presently disclosed photon enhanced power generation system provides a carrier generating photon converter in which at least some of those electrical carriers are produced as a result of photon absorption.

A Thermo-Photovoltaic (TPV) generator is illustrated in FIG. 2. An article by Zenker, et al. ("Efficiency and power density potential of combustion-driven thermophotovoltaic systems using GaSb photovoltaic cells," *IEEE Transactions on Electron Devices*, vol. 48, n. 2, February 2001, pp. 367-376) discusses the anticipated performance and the construction of TPV generators. Prior TPV generators make use of an input flux of heat to raise and set the temperature of a photon emitter. Some of the radiation emitted by the photon emitter is then absorbed by a photovoltaic (PV) cell and converted to electricity. The excess energy of those photons whose energy is greater than the bandgap of the PV-cell material is converted to waste heat that must be removed or else it will degrade the performance of the PV cell. In many prior TPV generators, the conversion efficiency is increased by selecting PV cell material that has a larger bandgap rather than a smaller bandgap. This selection, however, reduces the power that is generated since a smaller percentage of the incident photons are absorbed (because only those photons have energy greater than that higher bandgap). In general, to achieve enhanced conversion efficiency, it is preferable to maximize the difference between the temperature of the photon emitter and the temperature of the PV cell. This larger temperature difference reduces the amount of black body radiation of photons by the PV cell.

An article by A. Shakouri ("Thermoelectric, thermionic, and thermophotovoltaic energy conversion," *Proceedings of the 2005 International Conference on Thermoelectrics*, 2005) compares the relative merits of conventional thermoelectric and conventional thermophotovoltaic conversion processes. In this article, the author states "It seems that working with different energy carriers (electrons, photons, etc) and with reservoirs with different internal degrees of freedom may provide another opportunity to engineer the efficiency of the heat engines and to approach the entropy limit ($2^{nd}$ law of thermodynamics) more easily." The author, however, does not describe any method to make use of both photons and electrons in generating electrical power.

Many of the prior attempts at TE power generation have considered the case in which heat is transferred by conduction from a constant-temperature region through a heat exchanger to the hot end of the TE elements. In the case of conductive heat transfer, in contrast to convective heat transfer, the benefit of absorbing photons is not as great. Rather, most designs of conventional TE generators attempt to minimize the temperature difference between the heat source (e.g., the combustion products) and the hot end of the TE elements while still extracting enough heat from the heat source.

When heat is being extracted by convective heat transfer from a flowing gas or fluid by a heat exchanger, there typically is a thermal boundary layer between the central portion of the flow and the surface of the heat exchanger. Thus, there typically is a local temperature drop, $\delta T$, between the central portion of the flow and the surface of the heat exchanger facing the flowing gas or fluid. This temperature drop is in addition to the temperature drop between the inlet end and the outlet end of the flow. Even the case involving multiple thermally isolated heat exchangers (described later) would have this local temperature drop, $\delta T$. As a result, there would be some net photon flux toward the hot ends of the TE elements. An article by K. Matsubara ("Development of a high efficient thermoelectric stack for a waste exhaust heat recovery of vehicles," *Proceedings 21$^{st}$ International Conference on Thermoelectrics*, pp. 418-423, 2002) describes a demonstration of a thermoelectric generation system for recovering energy from the waste exhaust heat of an automobile engine. Measurements were made of the exhaust gas temperature at various points between the inlet and outlet ends of the heat exchanger. Additional measurements were made of the temperatures of the hot ends of the TE elements corresponding to those points. At any point along the flow direction, the article reports a difference of approximately 100K between the temperature of the exhaust gas and the temperature of the heat exchanger. The article also reports an additional temperature difference between the surface of the heat exchanger and the hot end of the TE elements. The enhanced TE generator disclosed herein makes use of these temperature differences to increase the total electrical power that is produced.

Utility

Motor vehicles such as cars and trucks are based on internal combustion engines. In most motor vehicles, a relatively small percentage (<25%) of the energy generated as a result of combusting the fuel in the engine is used to actually move the vehicle. Some of the energy generated (typically 1-10%) provides another useful function, being used to generate electricity. Typically, a belt driven electrical alternator is used to generate that electricity. Electricity has many uses in a motor vehicle. For example, electricity may be used to power accessories such as radios, fans, heaters and air conditioners, to power lights and electronic controllers and computers, to activate switches and valves, to move power windows and wiper blades, to adjust the suspension elements, to activate and control brakes and pumps, etc. A large percentage of the energy generated by the fuel combustion process (as much as 70%) is in the form of waste heat. Thermoelectric generators provide one means to recover the energy in this waste heat and convert that energy into electricity. Approximately 40% of the energy from the fuel combustion is carried in the hot exhaust gas. If a thermoelectric generator that can access this hot exhaust gas has a power conversion efficiency of only 10%, that generator can redirect 4% of the energy consumed into additional electrical power. This would represent a significant fraction of the electricity used in a vehicle.

The power generators disclosed herein could be relevant to any system that recovers waste heat from a flow of hot gas or fluid. This kind of waste heat recovery also is being considered for hot water heaters, gas turbines, industrial furnaces, and fuel-burning electrical power plants. While the generators described are capable of generating electric power from nearly any type of heat source, they are especially useful in extracting power from a thermal flow (a flow of hot gas or fluid).

SUMMARY

In a first embodiment disclosed herein, a system for generating power from a thermal source comprises a heat exchanger element having a first side facing the thermal source and a second side opposite the first side facing the thermal source, at least one P-type thermoelectric element positioned on the second side, each P-type thermoelectric element having a first end connected with the heat exchanger element and a second end opposite the first end, at least one N-type thermoelectric element positioned on the second side, each N-type thermoelectric element having a first end connected with the heat exchanger element, and a second end opposite the first end, and at least one photon converter, wherein at least a first of said at least one photon converter is connected to one of said at least one P-type thermoelectric element and also is connected with one of said at least one N-type thermoelectric element, wherein said at least a first of said at least one photon converter does not extend from the first end of any thermoelectric element to which said at least a first of said at least one photon converter is connected to the second end of said any thermoelectric element to which said at least a first of said at least one photon converter is connected.

In another embodiment disclosed herein a method for generating power from a thermal flow, comprises providing a heat exchanger element having a first side facing the thermal flow and a second side opposite the side facing the thermal flow, providing at least one P-type thermoelectric element and at least one N-type thermoelectric element, and providing at least one photon converter connected with a P-type thermoelectric element of said at least one P-type thermoelectric element and also connected with an N-type thermoelectric element of said at least one N-type thermoelectric elements.

These and other features and advantages will become further apparent from the detailed description and accompanying figures that follow. In the figures and description, numerals indicate the various features, like numerals referring to like features throughout both the drawings and the description.

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

Prior Art Thermoelectric Generation

Figure 1:
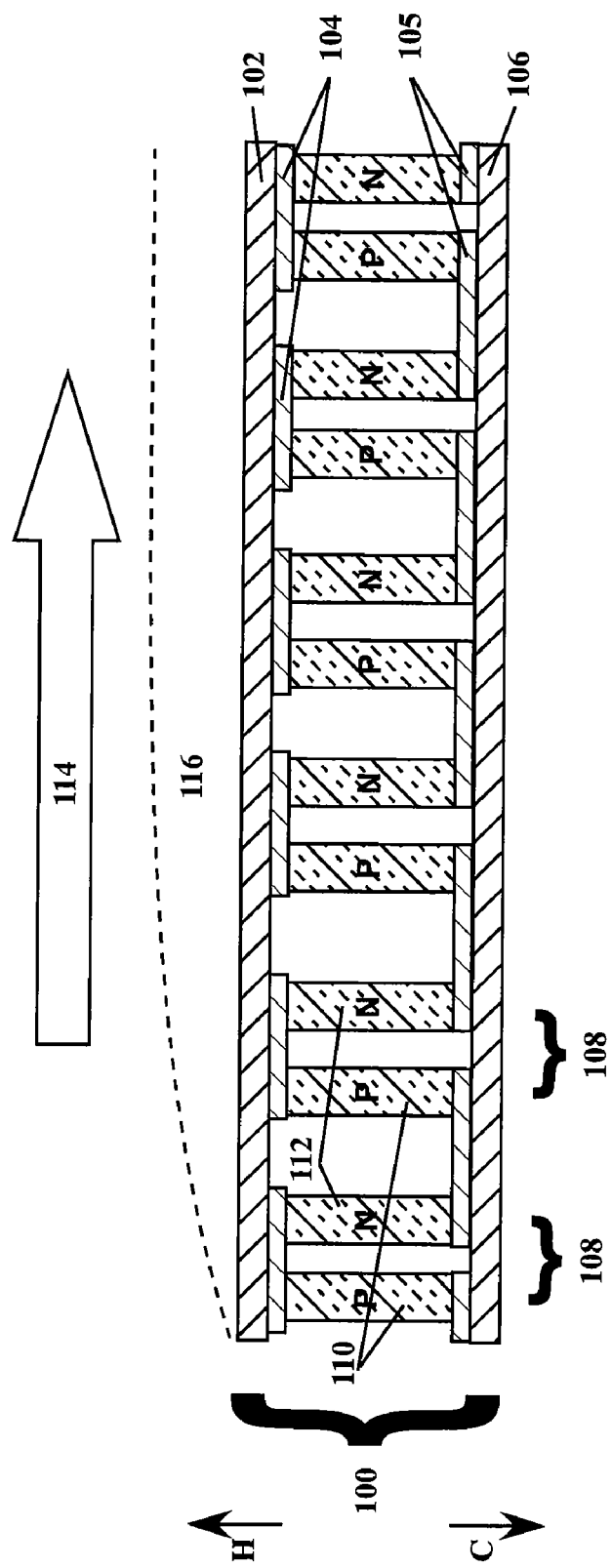
FIG. 1 depicts a thermoelectric generator, according to the prior art.

FIG. 1 shows an example of a prior art electricity generator using the thermoelectric effect. The thermoelectric (TE) generator 100 could be composed of a heat exchanger 102 near the thermal source 114 (at the "hot end" 150), another heat exchanger 106 located away from the thermal source 114 (at the "cold end" 160), and thermoelectric pairs 108 located between the heat exchangers 102,106. The thermoelectric pairs 108 are composed of a P-type TE element 110 and an N-type TE element 112 each extending from a connection to the "hot end" heat exchanger 102 to a connection to the "cold end" heat exchanger 106. The thermal gradient between the "hot end" 150 and the "cold end" 160 of the thermoelectric pair results in a net flow of electrical carriers from the "hot end" 150 to the "cold end" 160, or to the establishment of an electrical potential that opposes such a current flow. The circuit is formed by element conductive connections 104 between the P-type 110 and N-Type 112 TE elements. At the "hot end" 150, element conductive connections 104 are made between the elements 110,112 within each TE pair 108. At the "cold end" 160, output conductive connections 105 are made between the elements 110,112 between different TE pairs 108. The thermal flow 114 sets up a boundary layer 116 that reduces the "hot end" temperature downstream from the thermal flow, reducing the power generated by the thermoelectric pairs 108 that are downstream in relation to the thermal flow 114. This device does not utilize energy from photons created directly or indirectly from the thermal flow 114.

Prior Art Thermo-Photovoltaic Generation

Figure 2:
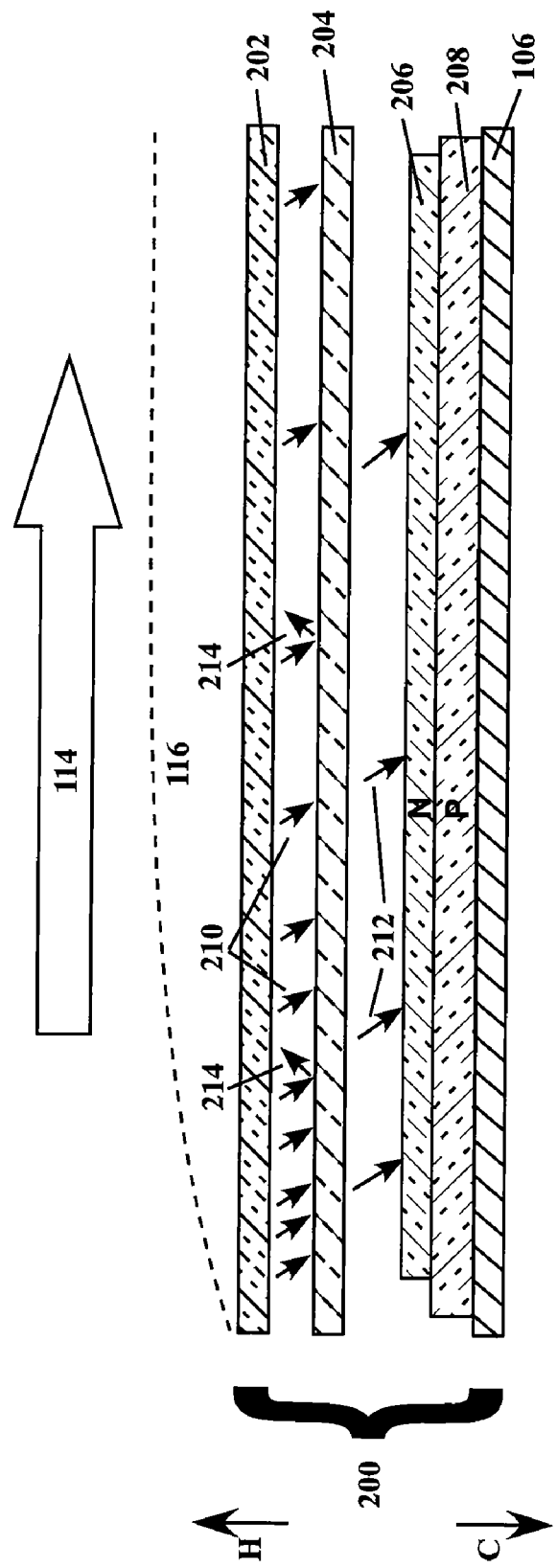
FIG. 2 depicts a thermophotovoltaic generator, according to the prior art.

FIG. 2 shows an example of a prior art thermophotovoltaic (TPV) generator 200. The TPV generator could be composed of a photon emitter 202 near the thermal source 114 (at the "hot end" 150), a heat exchanger 106 away from the thermal source 114 (at the "cold end" 160), and a photovoltaic cell 206,208. The photovoltaic cell is composed of an N-type material 206 deposited on a P-type material 208 such that photons 212 of the correct wavelength are absorbed by the photovoltaic cell and create a net electric current between the N-type 206 and P-type 208 material (or a voltage to oppose the flow of such a current). This energy may be captured by output leads (not shown) connected to the two materials 206, 208. The photon emitter 202 is a substance that emits photons as it is heated by the thermal source 114. The heat exchanger 106 keeps the photovoltaic cell 206,208 cool to prevent the heat from the thermal source 114 from damaging or altering the performance of the cell 206,208. To improve the efficiency of the photovoltaic cell 206,208 a filter 204 can be placed between the photon emitter 202 and the cell 206,208 that, preferably, reflects photons 214 having energy too low to be absorbed by the cell 206,208. In the case as shown, where the thermal source 114 is a thermal flow, a boundary layer 116 is established which reduces the temperature, and therefore the number of photons produced by, the portion of the photon emitter 202 that is downstream in relation to the flow 114. This device does not utilize the thermal gradient between the hot end 150 and the cold end 160 to directly generate electrical carriers or voltage. The temperature difference is only used to reduce the black body emission from the photovoltaic cell 206,208 which would degrade its efficiency.

Unlike the TPV system, the photon enhanced TE generator of the present disclosure can make use of the heat produced by absorbing the energetic photons to increase the hot end temperature of its TE elements, thereby generating more electrical power. In addition, the bandgap of the material comprising the photon converter of the present disclosure can be made smaller to capture more photons and, thus, generate more electrical power.

Overview of Photon Enhanced Thermoelectric Generation

Figure 3:
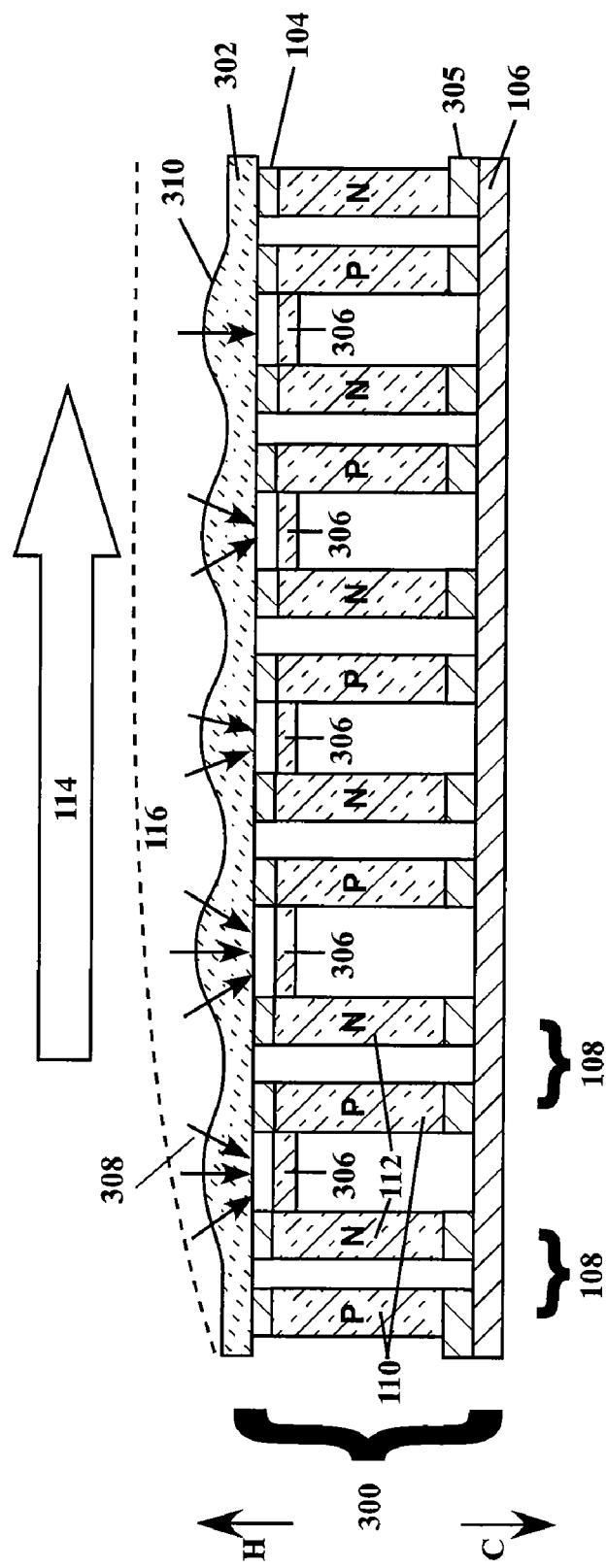
FIG. 3 depicts an embodiment of a photon enhanced thermoelectric generator in accordance with the present disclosure.
Figure 6:
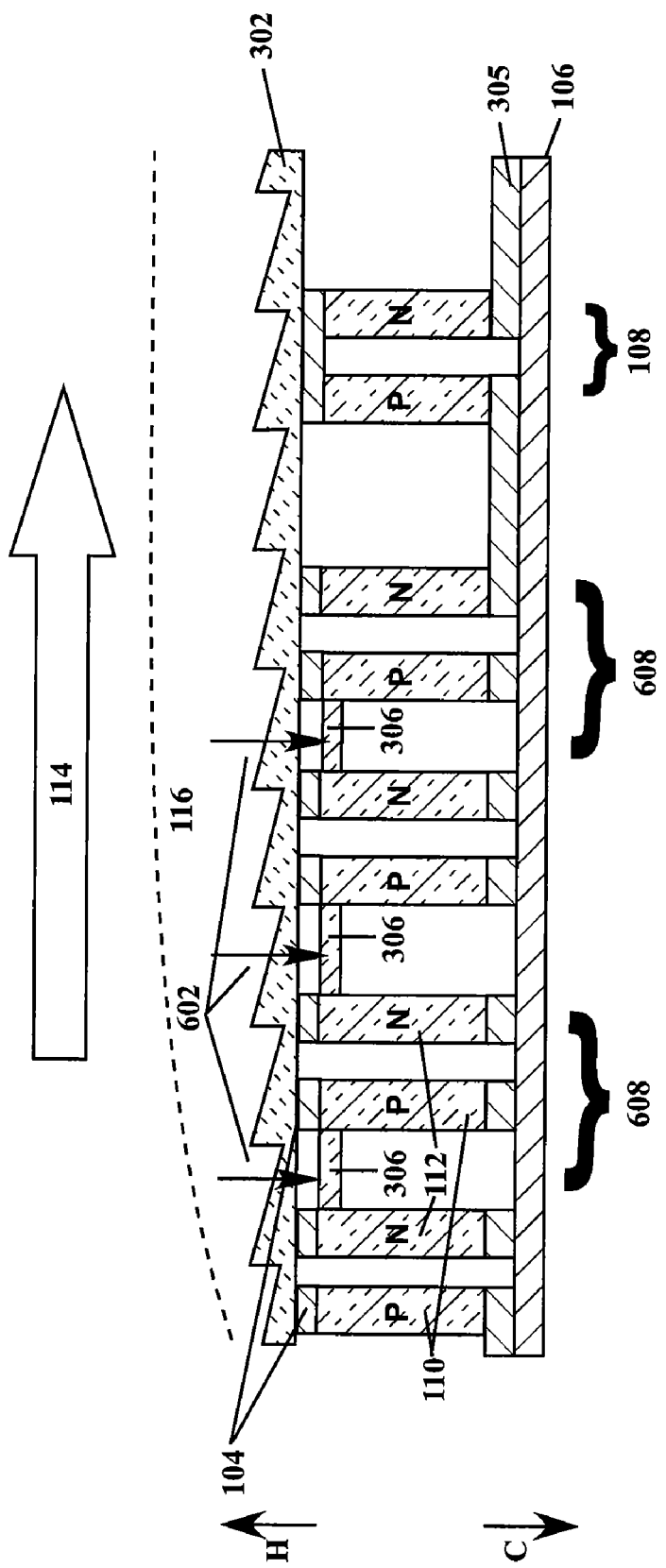
FIG. 6 depicts an embodiment of a photon enhanced thermoelectric generator combined with a thermoelectric generator in accordance with the present disclosure.
Figure 7:
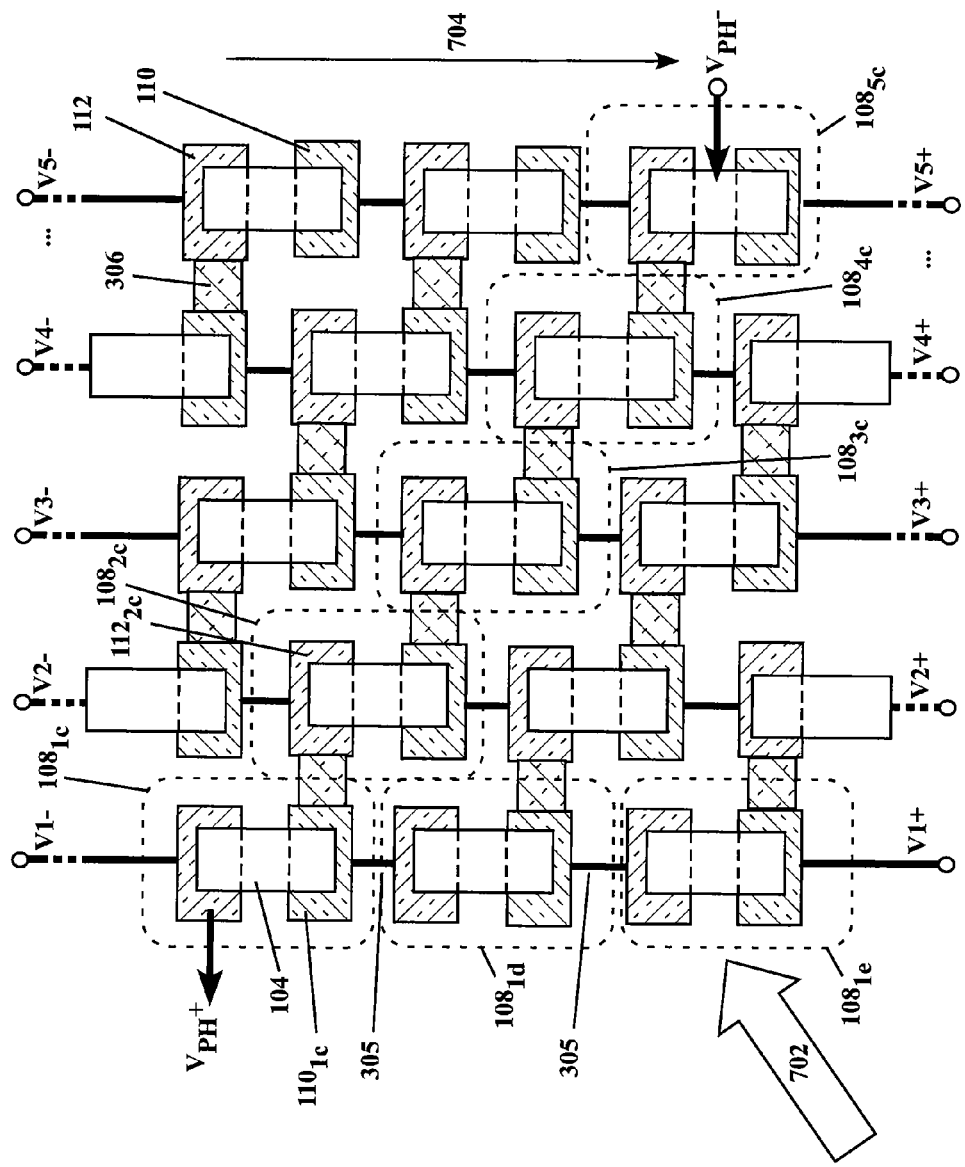
FIG. 7 depicts a plan view of an embodiment of a photon enhanced thermoelectric generator showing a first arrangement of the photon converters in accordance with the present disclosure.
Figure 8:
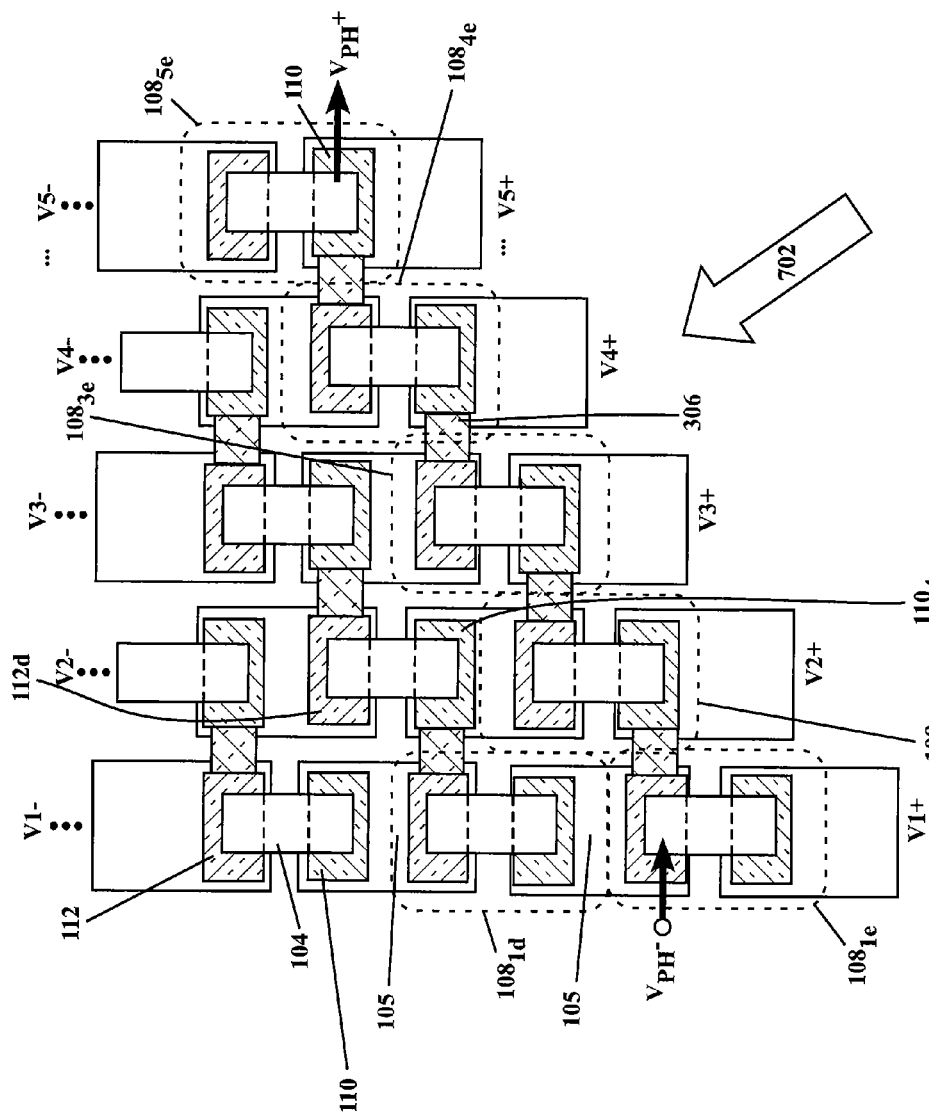
FIG. 8 depicts a subsection of FIG. 7 and shows additional details of the electrical connections in accordance with the present disclosure.

This disclosure describes power generation systems that can make use of both waste heat and infra-red radiation associated with that waste heat to generate electrical power. The waste heat may be carried in a flow of hot gas or fluid. One example of such a hot gas or fluid is the exhaust gas produced in a combustion process. These systems comprise both thermoelectric (TE) generators and photon converters as illustrated in FIGS. 3, 7 and 8. The photon converters can produce additional electrical current (and/or voltage) that augments the current (and/or voltage) produced by the TE generators. In all embodiments, at least some of the photon converters are integrated with some of the TE generators. In some embodiments, additional photovoltaic generators or TE generators are separate from the integrated photon converter/TE generators, as illustrated in FIGS. 5 and 6. This system could also comprise a heat exchanger/photon transmitter, as illustrated in FIGS. 3, 4, 5 and 6. The heat exchanger/photon transmitter extracts the heat from the flow of hot gas or fluid and couples that heat into the TE generator. The heat exchanger/photon transmitter also emits and couples infra-red radiation to the photon converter.

These systems make use of the temperature difference between the hot gas or fluid and the hot end of the TE generator to generate additional electrical power. In general, for extraction of heat from a flow of gas or fluid, the temperature of the hot gas or fluid is higher than the temperature of the hot end of the TE generator (the side nearest the flow). Matter produces an amount of black body radiation that depends on the temperature of that matter. Substantially more radiation is produced by matter that is at higher temperatures (in some cases, the amount of radiation is proportional to the fourth power of the temperature). Thus, there can be a net flow of radiation (i.e. photons) from the exhaust gas toward the hot end of the TE generator (and, therefore, toward the photon converter). A function of the heat exchanger is to pass or transmit this black body radiation through itself to the photon converter, so that this radiation is incident upon the photon converter.

Figure 4:
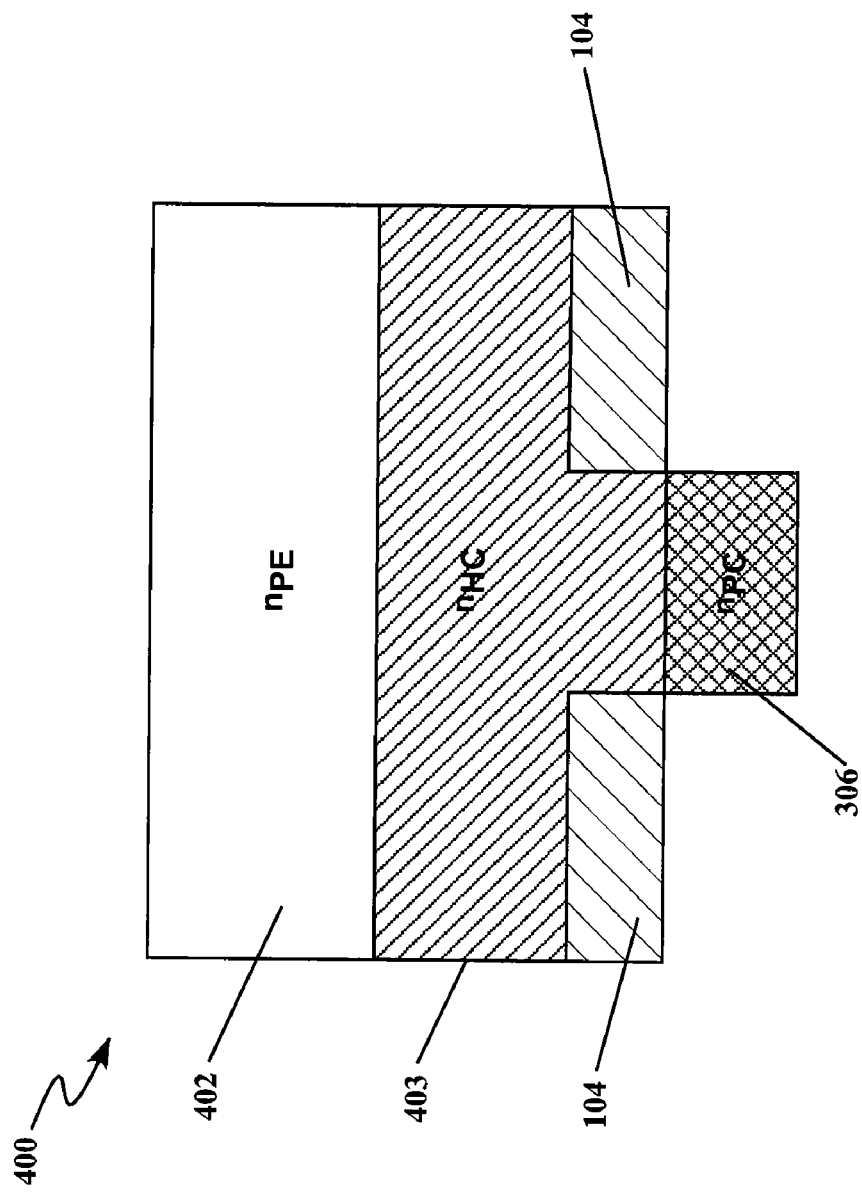
FIG. 4 depicts the refractive indices of an embodiment of a heat exchanger assembly for a photon enhanced thermoelectric generator and its relation to a photon converter in accordance with the present disclosure.
Figure 5:
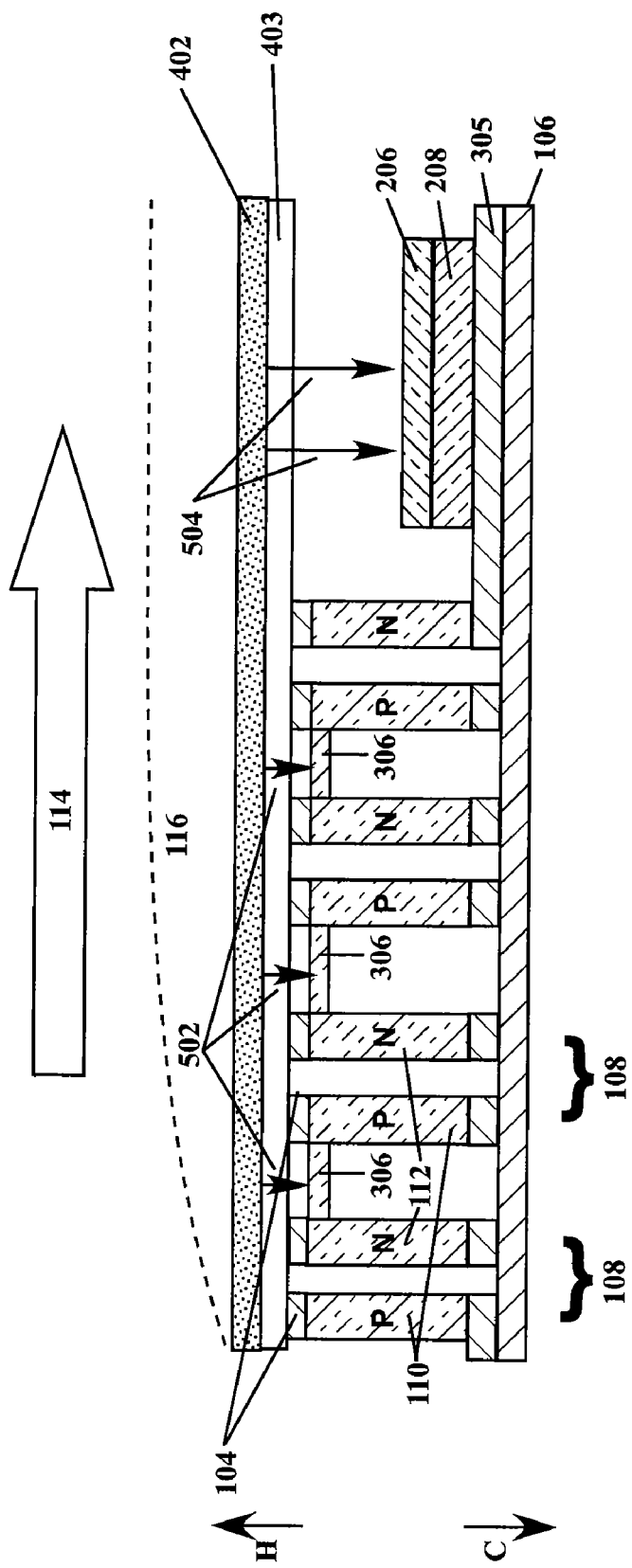
FIG. 5 depicts an embodiment of a photon enhanced thermoelectric generator combined with a thermophotovoltaic generator in accordance with the present disclosure.

The heat exchanger also may contain one or more photon emitters (illustrated in FIGS. 4 and 5). These photon emitters can emit radiation incident upon the photon converters, especially when those photon emitters are at elevated temperatures. The heat exchanger also may contain one or more optical structures (such as lens and mode-coupling regions) that increase the intensity of the incident radiation at the photon converters, as illustrated in FIGS. 3 and 4.

In some embodiments, the photon converter is a carrier generator that absorbs the incident radiation and generates carriers, both holes and electrons. The carrier generators can be integrated with and coupled to the TE generators. The generated holes are injected into a P-type TE element of a TE generator and the generated electrons are injected into an N-type TE element of a TE generator. These carriers may be generated not only as a result of the absorption of incident radiation but also as a result of thermal excitation. The carrier generators preferably do not extend fully between the hot end and the cold end of the TE elements. The carrier generators may be located near the hot ends of the TE elements, or the carrier generators may be located near the cold ends of the TE elements.

Each carrier generator may connect to a P-type TE element and an N-type TE element of two different TE couples or pairs, as illustrated in FIGS. 3, 7 and 8. The carrier generator generates and injects additional carriers, both holes and electrons. The generated holes are injected into the P-type element and the generated electrons are injected into the N-type element. The injected carriers, whether supplied near the hot end of a TE element or closer to the cold end of the TE element, result in a net difference in the concentration of majority carriers between the point of injection and at the cold end of that TE element. Thus, these injected carriers can contribute an additional component of the electrical current and thermal current that flow to the cold end of the TE element.

In order to separate the holes and electrons that are generated in the carrier generator region and selectively inject them into the P-type and N-type TE elements, these three regions preferably have a certain relationship between their electronic energy band structures. The bandgap (the difference between the energy of the conduction band minimum and the valence band maximum) of the carrier generator preferably is smaller than the bandgaps of the P-type element and the N-type element. Also, the conduction band edge of the carrier generator preferably is lower than the conduction band edge of the P-type element but higher than the conduction band edge of the N-type element. Likewise, the valence band edge of the carrier generator is at a higher energy than the valence band edge of the N-type element but at a lower energy than the valence band edge of the P-type element. This results in a Type II band alignment at both interfaces between the carrier generator and the two TE elements.

The basic power generating device can comprise at least one P-type thermoelectric (TE) element and at least one N-type TE element as well as carrier generators. Holes and electrons are produced in the P-type and the N-type TE elements, respectively, as a result of thermal excitation, preferably in doped extrinsic semiconductor material. As in a conventional TE generator, the TE elements have one end (the hot end) contacting a heat exchanger that is at a high temperature and have an opposite end (the cold end) contacting a heat exchanger or heat sink that is at a cold temperature. The gradient in temperature that is established in the TE elements results in a net flow of electrical carriers from the hot end to the cold end, or the establishment of an electrical potential to oppose such a current flow, because of a thermoelectric effect. The carrier generators generate and inject additional carriers, both holes and electrons. The generated holes are injected into the P-type element and the generated electrons are injected into the N-type element. These carriers may be generated as a result of the absorption of incident radiation, such as black body radiation, and as a result of thermal excitation. The electronic energy-band structures of the materials comprising the P-type and N-type TE elements and the carrier generators are such that the valence band offsets and the conduction band offsets at the interfaces between those materials favor the injection of the generated holes into P-type element and the injection of the generated electrons into the N-type element. In general, the P-type element, the N-type element and the carrier generator are composed of different materials (so that the desired electronic band alignments can be obtained). One preferred band alignment is the Type II alignment of both conduction and valence band edges.

The embodiments may include a "hot side" heat exchanger. This heat exchanger also functions as a transmitter through which the radiation absorbed by the carrier generator can pass. Thus, this heat exchanger is at least partially transparent at the wavelengths or photon energies of that radiation. In some embodiments, the heat exchanger also may contain one or more photon emitters. These photon emitters can emit radiation when the photon emitters are at elevated temperatures. At least some of the radiation emitted by the photon emitters is transmitted through the heat exchanger and can be absorbed by the carrier generator. In other embodiments, the heat exchanger also may contain one or more optical lens that concentrates the incident radiation onto the carrier generators.

The heat exchanger preferably has high thermal conductivity and also is at least partially transparent to the black body radiation produced by the hot gas or fluid and/or by the photon emitters. The heat exchanger also should have low electrical conductivity so that different TE couples are not electrically shorted together by that heat exchanger. For the case of hot exhaust gas produced in an automobile, the temperature of the exhaust gas and the hot end of the TE converter is between 600K and 1000K. Thus, the black body radiation has most of its photon energy between 0.15 and 0.7 electron volts. The corresponding wavelengths for most of the black body radiation that might be absorbed by the carrier generator are between 2 and 6 micrometers. Examples of materials from which the photon-transmitting heat exchanger may be constructed include, but are not limited to, aluminum nitride, boron nitride and silicon carbide.

The interface to the heat exchanger also may include electrical contacts and interconnect-metal regions that are part of the TE pairs. Some of these contacts and interconnect-metal regions, together with the carrier generators, may be arranged in such a manner that the intensity of incident radiation is concentrated at the carrier generators. For example, metallic contacts can be reflective to the photons usable by the carrier generators and act as guide-barriers to guide the photons to the carrier generators, as illustrated in FIG. 4.

The surface of the heat exchanger may be flat but it also may be non-flat and be shaped to accomplish various purposes. For example, the surface may have a relief pattern that forms an optical lens, as illustrated in the FIG. 3. This optical lens concentrates the incoming radiation onto the carrier generator regions. As another example, the surface may have a series of bevels that protrude into the path of the flowing gas or fluid, as illustrated in FIG. 6. These bevels increase the coupling of the heat into the heat exchanger.

In another embodiment (see FIG. 5), additional photon conversion is performed by one or more photovoltaic (PV) cells. These cells are preferably located near the cold end of the TE generator. The PV cells of this embodiment are similar in their operation to conventional photovoltaic cells, such as thermophotovoltaic (TPV) cells and solar cells. However they preferably are made from different materials that are more suitable to capture photons (of lower energy than captured by typical TPV cells or solar cells) emitted by the hot gas or fluid and by the photon emitter in the heat exchanger.

In another embodiment (see FIG. 6), in addition to the photon enhanced thermoelectric generators, heat conversion is performed by one or more prior art thermoelectric (TE) pair generators. These thermoelectric pairs are preferably located near the portions of the thermal flow that is too cold to produce convertible photons, but is hot enough for TE generation.

Additional details on specific characteristics of components of the photon enhanced power generation system and the inter-relationships between these components are described below.

An Embodiment of a Photon Enhance Thermoelectric Generator

The photon enhanced TE generator makes use of waste heat and generates electrical power. The waste heat may be carried in a flow of hot gas or fluid 114, 702, such as what is produced in a combustion process. The device comprises P-type and N-type thermoelectric (TE) elements 110, 112 as well as photon absorber/carrier generator (PA/CG) elements 306, as illustrated in FIGS. 3, 7, 8, 9 and 10. Holes and electrons are produced in the P-type and the N-type TE elements, respectively, as a result of thermal excitation, preferably in doped extrinsic semiconductor material. As in a conventional TE generator, these TE elements 110, 112 have one end (the hot end 150) contacting a heat exchanger 302 that is at a high temperature and have an opposite end (the cold end 160) contacting a heat exchanger or heat sink 106 that is at a cold temperature. The gradient in temperature that is established in the TE elements results in a net flow of electrical carriers within those elements from the hot end to the cold end, because of a thermoelectric effect, or results in the establishment of an electrical potential to oppose such a current flow. A PA/CG element 306 generates and injects additional carriers, both holes and electrons. The generated holes are injected into the P-type element 110 and the generated electrons are injected into the N-type element 112 abutting that carrier generator 306. These carriers may be generated as a result of the absorption of incident radiation 308, such as black body radiation, and as a result of thermal excitation.

FIG. 3 shows a side view of an embodiment of a photon enhanced thermoelectric (PETE) generator 300. FIG. 7 shows a top view (as viewed from the thermal flow) of a portion of that thermoelectric generator 300. Like the TE generator 100, the PETE generator 300 includes thermoelectric pairs 108 composed of a P-type TE element 110 and an N-type TE element 112 electrically connected to "hot end" 150 conductive strips 104 and "cold end" 160 output leads 305 and running between a "hot end" heat exchanger/photon transmitter 302 and a "cold end" heat exchanger 106. The photon enhanced TE generator 300 can have higher conversion efficiency compared to a generator comprising only TE elements because the photon enhanced TE generator include photon converter (in this example, photon absorber/carrier generator (PA/CG)) elements 306 connecting the N-type TE element 112 of one thermoelectric pair with the P-type TE element 110 of another thermoelectric pair. A PA/CG element 306 abuts both a P-type TE element 110 and an N-type TE element 112 and preferably is in physical, electrical and thermal contact with those TE elements. The PA/CG elements 306 serve two primary purposes. First, they absorb incident blackbody photons 308 and convert some of those photons 308 to carriers. The positive charge carriers (holes) are provided to their adjacent P-type TE elements 110 and the negative charge carriers (electrons) are provided to their adjacent N-type TE elements 112. This directly adds to the current (or voltage) generated by the thermoelectric pairs 108. Second, the PA/CG elements generate heat, both due to their position close to the thermal flow 114 and due to the absorption of photons 308 that have higher photon energy than the bandgap energy of the material comprising the PA/CG element 306. This added heat from the PA/CG element can be thermally conducted to the adjacent TE elements 110,112 and increases the thermal gradient between the "hot end" 150 and the "cold end" 160 of the thermoelectric pairs 108 of which those TE elements 110,112 are members. This increased heat supply, when added near the hot end 150 of the TE pairs 108, thus increases the thermoelectric current (or voltage) generated by those thermoelectric pairs 108.

In a first variation, the carrier generators 306 preferably are located near the hot ends 150 of the TE elements 110, 112, and these generators preferably do not extend fully between the hot end 150 and the cold end 160, as illustrated in FIG. 3. The electronic energy-band structures of the materials comprising the P-type and N-type TE elements and the carrier generators are such that the valence band offsets and the conduction band offsets at the interfaces between those materials favor the injection of the generated holes into P-type element and the injection of the generated electrons into the N-type element. In general, the P-type element 110, the N-type element 112 and the carrier generator 306 can be composed of different materials so that the desired electronic band alignments can be obtained. One band alignment is the Type II alignment of both conduction and valence band edges.

Figure 9:
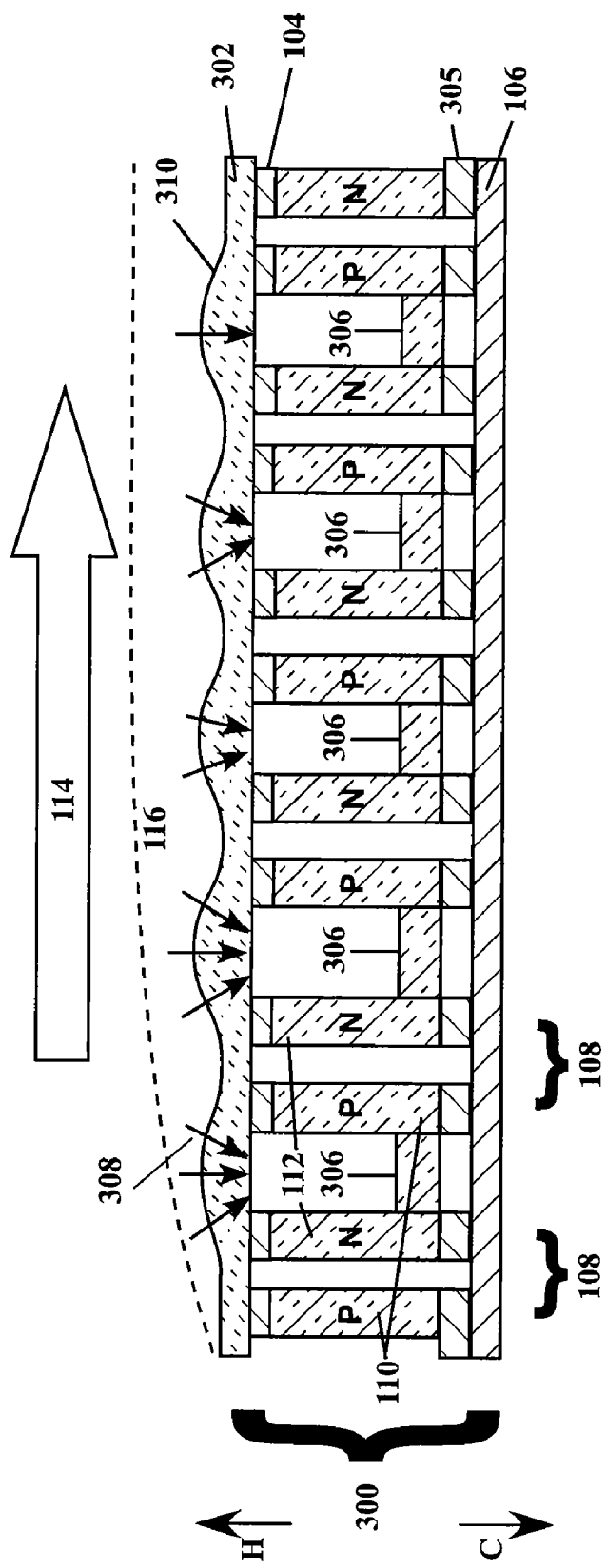
FIG. 9 depicts an embodiment of a photon enhanced thermoelectric generator in accordance with the present disclosure.

In a second variation, the carrier generators 306 preferably are located near the cold ends 160 of the TE elements 110, 112, and these generators preferably do not extend fully between the hot end 150 and the cold end 160, as illustrated in FIG. 9. The electronic energy-band structures of the materials comprising the P-type and N-type TE elements and the carrier generators are such that the valence band offsets and the conduction band offsets at the interfaces between those materials favor the injection of the generated holes into P-type element and the injection of the generated electrons into the N-type element. In general, the P-type element 110, the N-type element 112 and the carrier generator 306 can be composed of different materials so that the desired electronic band alignments can be obtained. One band alignment is the Type II alignment of both conduction and valence band edges.

It also is possible to construct a PETE generator that combines both the first variation and the second variation for the placement of the carrier generators 306 relative to the placement of the TE elements 110, 112. The material used for the carrier generators 306 located near the hot end 150 can be the same as or different from the material used for the other carrier generators 306 located near the cold end 160, depending on the specific needs of an implementation of the PETE generator. These two variations serve differing functions in terms of their contribution to the generating of electrical power by the PETE generator, as discussed below.

The Electrical Circuits

FIG. 7 depicts an embodiment of a PETE generator as viewed from the thermal source (e.g. a thermal flow). The thermoelectric pairs 108 consist of a P-type TE element 110 and an N-type TE element 112 connected at the "hot end" ("toward viewer" in the figure) by a conductive strip 104 (connecting within a pair) and at the "cold end" ("away from viewer" in the figure) by a pair of output leads 305 (connecting between adjacent TE pairs) that are depicted as lines in FIG. 7. The P-type TE element (e.g., $110_{1c}$) of one thermoelectric pair (e.g., $108_{1c}$) is connect to the N-type TE element (e.g., $112_{2c}$) of another thermoelectric pair (e.g., $108_{2c}$) by a PA/CG element 306. The "hot end" 150 of the thermoelectric pairs 108 could be attached to either a photon emitter/heat exchanger assembly (400, shown in FIG. 4) or by a heat exchanger/photon lens (302, shown in FIG. 3) to absorb heat from the thermal flow. The "cold end" 160 of the thermoelectric pairs 108 are connected to electrical ohmic contacts, interconnect metal, and output leads 305. These cold ends also could be attached to a heat exchanger (106, shown in FIG. 3) to dissipate heat from the thermoelectric pairs 108 and create the needed temperature gradient for the thermoelectric effect. The direction of the thermal flow 702 is depicted in FIG. 7 as going from lower left to upper right, although other flow directions also could be used. The arrangement of the P-type and N-type TE elements define the direction of the flow of holes 704, and the flow of positive electrical current, within the photon enhanced TE generator as being from the low voltage potential end having terminals V1− . . . V5− to the high voltage potential end having terminals V1+ . . . V5+.

FIG. 7 depicts the PA/CG element 306 connections to their adjacent TE element 110, 112 as being arranged perpendicular to the alignment of the electrical connection between one thermoelectric pair 108 and another thermoelectric pair 108 adjacent to it, giving a rectangular matrix arrangement of elements or a grid structure. Besides the rectangular geometry illustrated in FIG. 7, other geometries for interconnecting carrier generators 306 with TE elements 110,112 also are possible, such as a diamond-shaped lattice.

Multiple TE couples or pairs may be connected together electrically in series, in a way similar to that found in conventional TE generators. The example depicted in FIG. 7 shows five vertical columns that each contains five sets of TE pairs. FIG. 7 depicts only a portion of that photon enhanced TE generator, with only two or three sets of these TE pairs 108 shown for each column. Each series-connected set of TE couples is shown as a vertical column in FIG. 7 (e.g., comprising TE couples $108_{1a}$, $108_{1b}$, . . . $108_{1e}$). The series connection is a way to generate a higher voltage output. Each series-connected set can be considered as being a TE power generation circuit. Multiple series-connected sets (e.g., $108_{1a}$, $108_{1b}$, . . . $108_{1e}$ and $108_{2a}$, $108_{2b}$, . . . $108_{2e}$) of TE couples also may be connected together in multiple columns to form an electrical parallel circuit. The currents generated in these columns can be combined together to increase the total current produced by the power generator, as described below.

The carrier generators 306 are not part of any single column. Instead, they form an electrical carrier-generation and carrier-injection circuit that includes portions of several columns. The carrier generators 306 can contribute to the electrical current and/or voltage produced by the photon enhanced thermoelectric generator 300 in two ways. Each carrier generator 306 region serves as a source of both holes and electrons. In a first way, these holes and electrons are injected from a carrier generator 306 into its adjacent TE elements 110,112 (of different columns). These injected holes and electrons are directed to flow through the TE elements 110,112, away from their hot ends and to their cold ends. The recombination of the holes and electrons at the electrical contacts on the cold ends, and the flow of carriers through the leads 305 to other TE elements 110,112 and then to external circuit terminals V1+ . . . V5+ and V1− . . . V5− completes the electrical circuit for these carriers produced in the carrier generator 306 regions.

FIG. 7 also highlights an exemplary electrical interconnection of multiple carrier generators 306 that includes TE couples $108_{1c}$, $108_{2c}$, $108_{3c}$, $108_{4c}$ and $108_{5c}$, interconnected by carrier generators 306. This interconnection path terminates at the terminals $V_{PH}+$, $V_{PH}−$. As the figure shows, this interconnection pattern would seem to provide a possible path for the electrons and holes injected from a carrier generator 306 into its abutting TE elements 110,112 and then through the "hot end" electrically conductive strips 104. For example, the holes injected from a carrier generator 306 into a P-type TE element 110 also could flow toward the "hot end" of that TE element to the conductive strip 104. Likewise, the electrons injected from a carrier generator 306 into an N-type TE element 112 also could flow toward the "hot end" of that TE element to another conductive strip 104. These carriers then could recombine with other carriers at the conductive strips 104, resulting in an electrical current flow through those strips 104. However, in general, the terminals $V_{PH}+$, $V_{PH}−$ are preferably left unconnected and form an open circuit. Also the elements are located at approximately the same "slice" through the thermoelectric connection between terminals V1+ . . . V5+ and V1− . . . V5− such that the voltages at terminals $V_{PH}+$ and $V_{PH}−$ would not be affected by the thermoelectric current. Thus, an internal electrical potential gradient is established in each TE element 110,112 that hinders the flow of the injected holes and electrons toward the "hot end" electrical contacts at the conductive strips 104 and toward the hot end 150 of those TE elements. Instead, those injected holes and electrons would flow toward the cold end 160 of those TE elements 110,112 and thereby contributing to the photon enhanced thermoelectric current.

Figure 10:
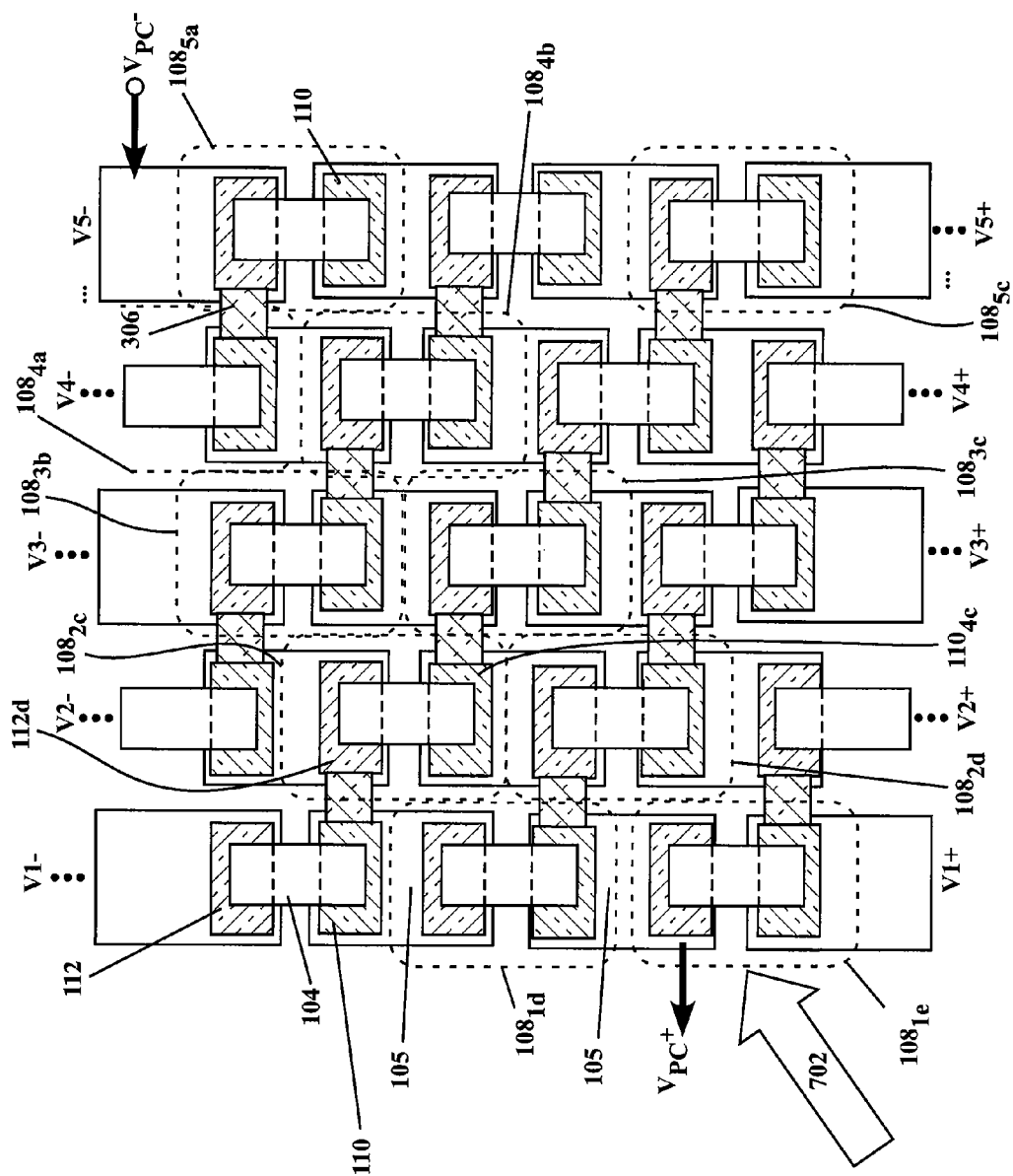
FIG. 10 depicts a plan view of an embodiment of a photon enhanced thermoelectric generator showing a second arrangement of the photon converters in accordance with the present disclosure.

FIG. 8 shows a view like that of FIGS. 7 and 10, but with the schematic connections (305 in FIG. 7) between different TE pairs 108 being shown in detail as electrically conductive connecting leads 105 between the P-type TE element 110 of one TE pair (e.g., $108_{1d}$) and an N-type TE element 112 of another TE pair (e.g., $108_{1e}$). The carrier generators 306 shown in FIG. 8 abut different sets of TE elements 110, 112 compared to the carrier generators shown in FIGS. 7 and 10. Note that for FIG. 8, a carrier generator 306 connects to an N-type TE element 112 located to the left side of that carrier generator and also connects to a P-type TE element 110 located to the right side of that carrier generator. In contrast, for FIGS. 7 and 10, a carrier generator 306 connects to a P-type TE element 110 located to its left side and to an N-type TE element 112 located to its right side. FIG. 8 also highlights an exemplary electrical interconnection of multiple carrier generators 306 that includes TE couples $108_{1e}$, $108_{2e}$, $108_{3e}$, $108_{4e}$ and $108_{5e}$, interconnected by carrier generators 306. This interconnection path terminates at the terminals $V_{PH}+$, $V_{PH}-$. As the figure shows, this interconnection provides another possible path for the electrons and holes injected from a carrier generator 306 into its abutting TE elements 110,112 and then through the "hot end" electrically conductive strips 104. For example, the holes injected from a carrier generator 306 into a P-type TE element 110 also could flow toward the "hot end" of that TE element to the conductive strip 104. Likewise, the electrons injected from a carrier generator 306 into an N-type TE element 112 also could flow toward the "hot end" of that TE element to another conductive strip 104. These carriers then could recombine with other carriers at the conductive strips 104, resulting in an electrical current flow through those strips 104. However, in general, the terminals $V_{PH}+$, $V_{PH}-$ are preferably left unconnected and form an open circuit. Typically, the terminals V1+ ... V5+ are connected together. Thus, the terminals $V_{PH}+$ and $V_{PH}-$ would be at the same electrical potential. This establishes an internal electrical potential gradient in each TE element 110, 112 that hinders the flow of the injected holes and electrons toward the "hot end" electrical contacts at the conductive strips 104 and toward the hot end 150 of those TE elements. Instead, those injected holes and electrons would flow toward the cold end 160 of those TE elements 110,112 and thereby contributing to the photon enhanced thermoelectric current.

There is yet another way in which the electrical carriers (holes and electrons) generated in a carrier generator 306 can contribute to the electrical current or voltage produced by a photon enhanced TE generator. It also is possible to locate the PA/CG elements 306 closer to the "cold end" 160 of the TE pairs 108 instead of being closer to the "hot end" 150 of the TE pairs 108. FIGS. 9 and 10 illustrate such an arrangement of the PA/CG elements 306. FIG. 9 shows a side-elevation view of this variation of the photon enhanced TE generator and FIG. 10 shows a top view (as viewed from the thermal flow) of this variation. In this case, the carriers injected into a TE element 110,112 from a PA/CG element 306 would flow toward the "cold end" of the TE elements 110,112 and then recombine with other carriers at the leads 105.

FIG. 10 also highlights an exemplary carrier generation circuit that includes TE couples $108_{5a}$, $108_{4b}$, $108_{3c}$, $108_{2d}$ and $108_{1e}$, interconnected by carrier generators 306. As the figure shows, a possible path for the electrons and holes injected from a carrier generator 306 into its abutting TE elements 110,112 is through the path that extends from terminal $V_{PC}+$ to terminal $V_{PC}-$. This path includes the N-type TE elements 112 from TE couples $108_{5a}$, $108_{4b}$, $108_{3c}$, $108_{2d}$ and $108_{1e}$ and the P-type TE elements 110 from TE couples $108_{4a}$, $108_{3b}$, $108_{2c}$, and $108_{1d}$ as well as the carrier generators 306 adjacent to those TE elements. For example, the holes injected from a carrier generator 306 into a P-type TE element 110 can flow toward the "cold end" of that TE element to the conductive lead 105. Likewise, the electrons injected from a carrier generator 306 into an N-type TE element 112 can flow toward the "cold end" of that TE element to another conductive lead 105. These carriers then can recombine with other carriers at the conductive leads 105, resulting in an electrical current flow through those leads 105. In this way, an electrical current can flow between the terminals $V_{PC}+$ and $V_{PC}-$, or an electrical voltage can be established across those terminals $V_{PC}+$, $V_{PC}-$ to oppose such a current flow.

For this variation of a PETE generator, the overall electrical current in the carrier generator circuit flows primarily near the cold end 160 of the structure. One benefit of locating the PA/CG elements near the "cold end" of the structure is that there is less black body radiation from those colder PA/CG elements 306. Therefore, a larger net number of photons could be absorbed in those "cold end" PA/CG elements.

The carrier generator circuit acts in a way similar to a photovoltaic generator. The voltage established at the two sides of a carrier generator 306 (where that carrier generator 306 contacts its adjacent TE elements 110,112) is determined by the bandgap energy of the material comprising the carrier generator 306 and by the energy band alignments of the materials comprising the carrier generator 306, the P-type TE element 110 and the N-type TE element 112. Only a small voltage adjustment results from the flow of injected carriers through the TE elements 110,112 and toward the "cold end" conductive leads 105. Also, generally negligible voltage drop is produced from the current flow through the electrical conductors 105. Thus, the net voltage produced between the terminals $V_{PC}+$, $V_{PC}-$ is roughly equal to N times the effective bandgap energy of the combination of carrier generator and P-type and N-type TE elements, where N is the number of carrier generators in that carrier generator photovoltaic circuit.

An exemplary configuration for the photon enhanced TE generator makes use of the terminals V1+ and V5− as the output terminals. Such a configuration, when implemented with the arrangement of FIG. 10, can combine the photovoltaic voltage from four carrier generators 306 coupled to adjacent TE elements 110, 112 and the thermoelectric voltage from one TE pair 108. Another exemplary configuration electrically connects together the thermoelectric terminals V1+ ... V5+; also, it electrically connects together the thermoelectric terminals V1− ... V5−. The electrical output current of this configuration combines in parallel the series electrical current through a sequence of four carrier generators plus the photon enhanced thermoelectric current through five parallel paths (or columns) each comprising a series connection of five TE couples. For such an electrical connection pattern, the voltage produced at the output terminals is determined by the series connection of four carrier generators 306 coupled to adjacent TE elements 110,112 and further connected in series to a TE pair 108. In this way, the photovoltaic combination of elements 306,110,112 can be use to define the voltage across a photon enhance TE pair 108. Thus, the power generator can have a large voltage, as determined by the bandgap energy of the PA/CG material, and also a large current, as provided by the TE elements and augmented by the carriers injected from the PA/CG elements.

In summary, one can think of the power generator as including both photon enhanced thermoelectric power-generation circuits and photo-carrier generating photovoltaic power-generation circuits. The power generation system's relation to the direction of the thermal flow is selected to ensure that appropriate groupings of TE elements 110, 112 and photon absorbers 306 encounter the same intensity of photon flux and heat flux. A combination of thermoelectric power, photon enhanced thermoelectric power and photovoltaic power can potentially be obtained from the power generator.

The enhanced TE generator disclosed herein can generate more electrical power than conventional TE generators. This increase in power can be several percent to potentially as high as several hundred percent. This increase results from the higher current that can flow through the TE elements. These currents have some components due to the thermoelectric effect in the TE elements and other components due to the carriers injected into the TE elements from the carrier generators.

The photon-based enhancement in the amount of power generated is greater when the temperature difference between the hot gas or fluid and the hot end is larger. In order for a TE generator to produce much power per unit area of the TE elements, substantial heat must be extracted from the hot gas or fluid and coupled into the hot ends of the TE elements. This function of heat extraction is done by the heat exchanger located on the hot side. In the case of waste heat recovery, the cost of the fuel and the cost of producing the heat in the hot gas or fluid already are accounted. That waste heat is free. Thus, the effective cost of having a TE generator mainly is the cost of the generator itself. This cost is reduced when the TE generator produces a maximum amount of power per unit area of the TE elements. For a typical automobile or truck engine, the TE generator produces maximum power when the temperature of the hot end of the TE elements is substantially lower than the temperature of the hot exhaust gas when that gas first enters the TE generator. An example of this is shown in an article by T. J. Hendricks and J. A. Lustbader, "Advanced Thermoelectric Power System Investigations for Light-Duty and Heavy-Duty Applications: Part I", *Proceedings of the 21$^{st}$ International Conference on Thermoelectrics,* Long Beach, Calif., IEEE Catalogue #02TH8657, pp. 381-386, 2002. According to their analysis, the optimal temperature difference between the input exhaust gas and the hot side of the TE elements is greater than 300K.

For maximum power output (per unit area of TE elements), the TE generator is operated at a hot side temperature, $T_H$, that is substantially lower than the temperature of the exhaust gas at the inlet. The power output also increases as the cold side temperature, $T_C$, is reduced.

Photon Converter/Carrier Generator

The carrier generator generates and injects additional carriers, both holes and electrons. The generated holes are injected into a P-type TE element and the generated electrons are injected into an N-type TE element. These carriers may be generated as a result of the absorption of incident radiation, such as black body radiation, and as a result of thermal excitation. Each carrier generator may connect to a P-type element and an N-type element of two different TE couples. The injected carriers, which are supplied only to the hot end of a TE element, result in a net difference in the concentration of majority carriers at the hot end and at the cold end of a TE element. Thus, they contribute an additional component of the electrical current and thermal current that flow from the hot end to the cold end.

In order to separate the holes and electrons that are generated in the carrier generator region and inject them into the P-type and N-type elements, these three regions preferably have a certain relationship between their electronic energy band structures. The bandgap (the difference between the energy of the conduction band minimum and the valence band maximum) of the carrier generator preferably is smaller than the bandgaps of the P-type element and the N-type element. Also, the conduction band edge of the carrier generator preferably is lower than the conduction band edge of the P-type element but higher than the conduction band edge of the N-type element. Likewise, the valence band edge is at a higher energy than the valence band edge of the N-type element but at a lower energy than the valence band edge of the P-type element. This results in a Type II band alignment at both interfaces between the carrier generator and the two TE elements.

Electronic Energy-Band Structures

The electronic band structures of the TE elements and carrier generators should be appropriate to direct the carriers generated in the carrier generator regions not only into the adjacent TE elements but also through those elements, from their hot end to their cold end. The P-type element and the N-type element of each TE couple are electrically connected together. Thus, they have a common Fermi level. The N-type element and the P-type element can be heavily doped. Therefore, the Fermi level would be located near the conduction band edge of the N-type element and near the valence band edge of the P-type element. The carrier generator region does not need to be doped. The Fermi level would be located in the band gap of the carrier generator region. The valence and conduction bands of the carrier generator regions may be tilted. This tilt could be such that the injection of electrons into the N-type element and the injection of holes into the P-type element are enhanced by that electric field. Large energy barriers can exist between the P-type element and the N-type element of a given TE couple. These barriers would prevent the flow of the injected carriers directly between those elements. Thus, the injected carriers remain in an element and flow from the hot side to the cold side of that element.

Thermoelectric Pair

The P-type TE element and the N-type TE element preferably are constructed from materials that have good thermoelectric properties at a temperature range that includes the hot end and the cold end temperatures. In general, these materials are semiconductors that have a combination of large Seebeck coefficient, high electrical conductivity and low thermal conductivity. Furthermore, the energy band levels of these materials should have the proper alignment with respect to the conduction and valence band edges of the photon absorber/carrier generator material. This constraint has been described above. One example of TE materials suitable for use with a PbSe photon absorber is PbS for the P-type element and PbTe for the N-type element.

Both PbS and PbTe are known thermoelectric materials and have fairly high thermoelectric figure of merit, ZT. Other materials that have good thermoelectric properties at the temperature range of interest also could be used. For example, some versions of AgPbSbTe have high thermoelectric figure of merit. The valence and conduction band edges of AgPbSbTe are close to the valence and conduction band energies of PbTe. Other materials that may be usable include $Zn_4Sb_3$, filled Skutterudites and partially filled Skutterudites. Thin film thermoelectric materials also may be usable for the TE elements of the presently disclosed embodiments. For example, the material may be a PbSeTe/PbTe quantum dot superlattice or a PbTe/PbEuTe multiple quantum well structure. The material also could possibly be a SiGe/Si multiple quantum well structure or a $B_xC/B_yC$ multiple quantum well structure. There are many known ways to fabricate the materials for the TE elements, such as the known materials listed above.

Black Body Radiation

The maximum intensity and the photon-energy (or wavelength) content of the black body spectrum depends on the temperature of the black body emitter. This is a well-known phenomenon. The black both spectra that may be produced by matter at a higher temperature has a greater intensity (larger number of photons) and is shifted to shorter wavelengths (higher photon energies) compared to the black body spectra that may be produced at a lower temperature. The photon absorbers can absorb incident photons (such as those produced by the hot gas or fluid or by the photon emitter). The photon absorbers also can emit photons because of their own temperature. If we, for simplicity, assume that the photon absorbers and black body emitters have the same overall area, we can estimate the energy spectrum of the net incident photons.

The intensity of the net photons is greatest where the temperature of the black body emitter is greatest. That would be at locations closest to the inlet of the heat exchanger, and farther from the outlet of the heat exchanger. Note that the spectra for the net photons are shifted toward higher energy compared to the raw black body emission spectra. The photon absorber is typically constructed from a semiconductor material whose bandgap is matched to capture a large percentage of the net incident photons. The material of the photon absorber also is preferably a direct bandgap semiconductor. A direct bandgap material typically has higher carrier generation efficiency (per incident photon) compared to an indirect bandgap material. Another preferred characteristic of the photon absorber/carrier generator material is that the carriers generated therein have a long non-radiative recombination lifetime and a correspondingly long diffusion length. One example of a material that is suitable for the photon absorber is PbSe. Another example is InSb. Variants of these materials might be used to further adjust their bandgap energy. For example, PbSnSe has a smaller bandgap than PbSe and PbEuSe has a larger bandgap than PbSe. The material need not be intentionally doped and may be an intrinsic semiconductor. The material preferably has excellent crystalline quality, although polycrystalline material also may be suitable.

Constructing a Combination of Thermoelectric Elements and a Photon Converter

In fabricating the photon enhanced TE generator, attention should be paid to the interfaces between the photon converter (carrier generator) and the P-type and N-type TE elements. Recombination of the generated carriers at these interfaces should be minimized. Although many methods could be used to fabricate the combination of carrier generator with the P-type and N-type elements, two methods are discussed next as examples. In one example, a piece of PbSe is diffusion bonded to a piece of PbS. The bonding is done at an elevated temperature with a small force applied to press the two pieces together. The PbSe is then thinned to a desired thickness, which may be less than 0.1 to 0.005 mm. The PbSe face is then diffusion bonded to a piece of PbTe. Part of the PbSe is removed from between the PbTe and PbS pieces by some means such as cutting, ablation or etching. The space created by removing the PbSe is then filled with an electrically and thermally insulating material, such as silica, beryllia or alumina. The resultant piece comprises a P-type element, an N-type element and a carrier generator that is located near one end of those elements (with the other ends of those elements separated by the insulating material). Each of these pieces would be a part of a different TE couple, as discussed above. The various pieces of TE elements can be assembled into TE couples and TE modules using known methods for constructing TE modules.

Another exemplary fabrication method involves first constructing a 2-dimensional array of TE couples with the TE elements arranged in a desired pattern. As part of this construction, the ohmic contacts and the metal interconnects located at the cold ends of the elements may be formed. Also, the spaces between the TE elements are filled with an electrically and thermally insulating material, such as silica, beryllia or alumina. A film of material (e.g., the PbSe) for the carrier generator is then deposited and patterned onto the construction. The carrier generator material is in physical contact with selected portions of hot ends of the N-type and P-type elements. A thin film of an electrical insulator, which needs not be a thermal insulator but which needs to be transparent to the incident radiation, is deposited over the exposed top and sides of the regions of carrier generator material. Known methods to deposit material such as PbSe include sputtering and thermally evaporating PbSe source material onto the hot ends of the elements. Also, the insulating material can be deposited by sputtering or evaporation or some other means to cover the space between the elements. The PbSe can be annealed in combinations of halogens, oxygen and air to form the optically active film. Evaporation and sputtering can be done at close to room temperatures and various polymers can be used to define those regions in which the PbSe contacts the underlying material of the TE elements and insulator. The PbSe is removed from the other areas, which are covered by the polymer, when the polymer is dissolved or etched away in a subsequent fabrication step. The metal for the ohmic contacts (to the hot ends of the TE elements) and the interconnect metal (between those elements) can be deposited in additional steps by common methods such as thermal or e-beam evaporation.

These descriptions of possible fabrication methods are intended to be exemplary rather than exclusive. Alternate combinations of the fabrication techniques involved also could be used, as well as yet other fabrication techniques. For example, a thin layer of PbSe could be deposited and patterned onto a piece of PbS and the insulating material also could be deposited and patterned, by means such an evaporation. The PbSe/insulator covered piece of PbS could then be bonded to a piece of PbTe.

Heat Exchanger/Heat Conductor/Photon Transmitter

The photon enhanced TE generator makes use of the difference between the temperature of the hot gas or fluid 114 and the temperature at the hot end of the TE elements 110, 112 (and at the carrier generators 306). Because of the higher temperature of the hot gas or fluid, there can be a net flux of radiation or photons 308 from the hot gas or fluid toward the carrier generators. The absorption of these photons to generate holes and electrons provides a means to increase the power generated by the enhanced TE generator.

This embodiment also may include a hot side heat exchanger 302. This heat exchanger also functions as a transmitter through which the radiation 308 (some of which is absorbed by the carrier generators 306) can pass. Thus, this heat exchanger is at least partially transparent at the wavelengths or photon energies of that radiation.

To further increase efficiency, a special photon transmitting heat exchanger 302 can be placed on the PETE generator 300 proximal to the thermal flow 114. This heat exchanger 302 is different from either the heat exchanger 102 of the TE generator or the photon emitter 202 of the TPV generator 200. Unlike the heat exchanger 102, the optical properties of the heat exchanger 302 are important. Typically, a heat exchanger 102 would be made of a metal to maximize its thermal conductivity. The heat exchanger preferred for the PETE generator 300 is preferably made of a material that is either photon-transparent (as shown in FIGS. 3, 6 and 9) or contains a material that absorbs heat and generates photons (as shown in FIGS. 4 and 5), so that the PA/CG elements 306 would have photons to absorb. Unlike the photon emitter 202 of the TPV generator 200, the photon transmitting heat exchanger 302 would preferably be thermally conductive to provide as much thermal energy as possible to the thermoelectric pairs 108. The photon emitter 202 would preferably be thermally insulating in order to protect the photovoltaic cell 206,208 from being heated by the hot photon emitter 202.

In the embodiments where the heat exchanger 302 is transparent to photons that can be absorbed by the photon converter 306, it can further contain lens shapes 310 that function to direct the incident photons to the PA/CG elements 306. In contrast, at the "cold end" 160 of the TE elements 110, 112, the heat exchanger 106 and electrical interconnect leads 305, 105 can be made of reflective metal to further enhance the number of photons available to PA/CG elements 306.

There may be a small air gap between a photon converter region 306 and the heat exchanger 302. In some embodiments, the surface of the photon converter region 306 that faces the heat exchanger may be textured to facilitate the coupling of the incident radiation into the photon converter (since the optical refractive index of the photon converter material typically is substantially greater than 1, the refractive index of air).

FIG. 4 shows an embodiment of a heat exchanger assembly 400 that can be used instead of the photon transmitting heat exchanger structure 302. For this embodiment, the assembly 400 can be composed of a photon emitter 402 and a heat conductor 403 that is transparent to at least some of the photons emitted by the photon emitter 402. The refractive index of the photon emitter 402 is given as $n_{PE}$, the refractive index of the heat conductor 403 is given as $n_{HC}$, and the refractive index of the PA/CGs 306 is given as $n_{PC}$. Although the heat conductor 403 is shown in the figure as physically contacting the PA/CG 306, there could instead be a small air gap between the PA/CG element 306 and the heat conductor 403.

In one version of the embodiment of FIG. 4, one may be able to think of the photon emitter 402 and the array of PA/CGs 306 as a pair of dielectric radiation-confining (or optical mode confining) regions that are separated by a "cladding" region comprising the heat conductor 403. Optical radiation can be coupled between these two higher-index regions, with that coupling greatest when the optical refractive indices, $n_{PC}$ and $n_{PE}$, of those two regions are equal. An exemplary photon emitter 402 material can be silicon carbide or graphite and an exemplary heat conductor 403 material can be aluminum nitride or calcium fluoride. With materials such as these, enhancements in the net photon intensity of several-fold are possible. The refractive index of exemplary PA/CG 306 materials (e.g., PbSe and InSb) is large. Thus, there is a strong benefit to using a photon emitter 402 that has a comparably large refractive index. One may even use the same material for the photon emitter 402 and the PA/CG 306. Then, the enhancement of the photon intensity could be greater than ten-fold.

In another version of the embodiment of FIG. 4, the heat conductor material can have a higher refractive index than the photon emitter material ($n_{HC} > n_{PE}$). An example of a photon emitting material 402 that has a lower refractive index is soot. Note that materials that are more porous, with a larger surface area, may have a lower effective refractive index. There are two possible variants of this embodiment: in one variant $n_{HC} > n_{PC}$ and in the other variant $n_{HC} < n_{PC}$. With the heat conductor 403 having the highest optical refractive index, $n_{HC} > n_{PC}$, one may think of that heat conductor 403 as being a mode conducting region separating two lower index optical mode confining regions (the photon emitter 402 and the array of photon converters 306). Note that the other face of those two regions typically could be in contact with a low-index material such as air, the hot gas or fluid, or a thermal insulator such as silica. Significant levels of optical radiation can be coupled into the PA/CG 306 regions if the optical refractive index of that PA/CG material $n_{PC}$ is not too much lower than the optical refractive index of the heat conductor $n_{HC}$ and if the thickness of the heat conductor 403 is sufficiently small (less than one optical wavelength). This variant, although possible, may be less likely since most materials that are transparent to the radiation have a refractive index that is smaller than the refractive index of the PA/CG material $n_{PC}$.

With the PA/CG 306 having the highest optical refractive index, $n_{HC} < n_{PC}$, one may think of the PA/CG 306 as an eventual sink of the emitted photons, with the heat conductor 403 possibly acting as an "impedance matching" region. The photons will be drawn out of the photon emitter 402, because of the higher refractive index of the heat conductor 403 material. In addition, the photons will be drawn into the PA/CG 306 regions because it has the highest refractive index. The refractive index of PbSe is greater than 5 and the refractive index of InSb is close to 4. This index is larger than the refractive index of many heat conductor materials. For example, the refractive index of aluminum nitride is only slightly larger than 2.

The photon enhanced TE generator also includes electrical contacts and interconnect-metal regions. Some of these contacts and interconnect-metal regions 104, together with the photon absorber/carrier generators 306, may be arranged in such a manner that the intensity of incident radiation is concentrated at the carrier generators. For example, the optical mode-confining region that includes the PA/CG 306 regions can comprise a periodic set of metal interconnect regions 104 and PA/CG 306 regions. That mode-confining region has an effective refractive index that is obtained by a volume-weighted combination of the refractive indices of the metal and of the PA/CG 306 material. The optical radiation is reflected from the metal regions (resembling the case of a microwave metal-confined waveguide). The PA/CG 306 regions represent gaps in the metal into which the optical radiation can leak and become absorbed.

Photon Emitter

The heat exchanger also may contain one or more photon emitters. These photon emitters can emit radiation (black body radiation) as a result of their elevated temperatures. This distribution or radiation spectrum depends on the temperature of the photon emitter and on its emissivity. Examples of material that have high emissivity and that could be used for the photon emitter include graphite, carbon nanorods, soot, silicon carbide and micro-structured metal. The distribution of the net photons incident on the photon absorber/carrier generator regions depends on not only the emitter characteristics but also on the temperature of the photon absorber and the band gap of the material comprising the photon absorber.

The peak of this distribution is reduced as the difference between the temperatures of the photon emitter and the photon absorber is reduced.

Knowledge of these distributions or photon spectra can be applied in selecting the bandgap of the photon absorber material. For example, a photon-absorber bandgap of 0.15-0.25 electron volts will permit absorption of a very large percentage of the incident photons. Such a bandgap value also is consistent with the carrier injection function of the photon absorber/carrier generator (as discussed above). Incidentally, in many prior conventional TPV converters, the bandgap of their photon absorber (i.e., the PV cell) is larger than the energy of the peak in the incident photon spectrum. These prior TPV converters preferably also include an optical filter that selectively reflects those photons whose energy is lower than the bandgap energy, with the optical filter transmitting only the high-energy photons. When the bandgap of the photon absorber is small, as in the present example, such an optical filter typically is not necessary. Nevertheless, the photon enhanced TE generator could include an optical filter for selectively reflecting and selectively transmitting different photons of the incident radiation.

Much higher intensity of photons may be coupled into the photon absorber by using a thin heat conductor. In this case, the spacing between the photon emitter and the photon absorber is small compared to the effective wavelength of the radiation. Several embodiments for which the thickness of the heat conductor is small or comparable to the size of the wavelength of radiation in the material are possible. In one embodiment, the optical refractive index of the photon emitter material and of the photon absorber material preferably are higher than the optical refractive index of the heat conductor. The enhancement in the net photon intensity at the photon absorber has been discussed for this case in an article by J. L. Pan, et al. ("Very large radiative transfer over small distances from a black body for thermophotovoltaic applications," *IEEE Transactions on Electron Devices*, vol. 47, n. 1, January 2000, pp. 241-249). Although the authors of this article consider only the situation for which the photon emitter and the photon absorber are separated by air or vacuum spacer (having a refractive index of 1), their analysis can be applied to the present situation. This enhancement depends on the square of the ratio of the refractive index of the photon emitter material to the refractive index of the heat conductor material (i.e., the spacer), if the photon emitter material has lower refractive index than the photon absorber material. Alternatively, if the photon emitter material has the highest refractive index, the enhancement depends on the square of the ratio of the refractive index of the photon absorber material to the refractive index of the heat conductor material. For this version of the embodiment, the refractive index of the heat conductor (the spacer) is preferably minimized.

Combining Photon Enhanced TE Generator with Thermophotovoltaic Generator

The heat exchanger assembly of this embodiment can be a simple radiation-transmitting heat exchanger or it can include a photon emitter in addition to the heat conductor. In one example of this embodiment, the side of the heat exchanger that faces the TE element is at a constant hot end temperature that is substantially lower than the temperature of the hot gas or fluid near the inlet of the heat exchanger. There is a large difference at the inlet end between the temperature of the hot gas or fluid and the temperature at the hot ends of the TE elements (and at the photon absorber). Thus, the net flux of photons toward the photon converters is large. The enhancement in the generated electrical power contributed by the photon converters can be substantial. However, the corresponding temperature difference at the outlet end is small (since much heat has already been extracted from the hot flow). At the outlet end, the temperature at the lower side of the hot-side heat exchanger assembly still is substantially greater than the temperature at the cold ends of the TE elements, and also the temperature of the cold-side heat exchanger or heat sink. A photovoltaic cell can be constructed upon the cold side heat exchanger or heat sink. This PV cell is thus at the cold side temperature. Thus, there is substantial net flux of photons from the heat exchanger to the PV cell.

FIG. 5 depicts an embodiment that combines a PETE generator with the TPV system. The upstream elements are thermoelectric pairs 108 connected with PA/CG elements 306, the PA/CG elements 306 providing additional energy to the system by the absorption of photons 502 emitted by the photon emitter layer 402. A photovoltaic cell comprising layers 206,208 can be placed to capture photons 504 emitted by the photon emitter layer 402 downstream, where the temperature of the thermal flow 114 is reduced.

Combining Photon Enhanced TE Generator with Conventional TE Generator

The intensity of net incident photons is greatest for those TE couples and carrier generator regions that are located closest to the inlet of the heat exchanger. The temperature of the hot gas or fluid is highest near the inlet of the heat exchanger. It is most beneficial to use the enhanced TE generators at those locations. An embodiment of a TE generation system includes two different kinds of TE generators combined together. The photon enhanced TE generators of the present embodiment are located near the inlet end of the heat exchanger. Conventional TE generators, which do not contain the photon absorber/carrier generator regions, are located near the outlet end of the heat exchanger. Both the enhanced TE generator and the conventional TE generator are coupled to the same hot side heat exchanger. They also may be coupled to the same cold side heat exchanger (or heat sink). The electrical output connections that provide the output electrical power of the generation system typically would be taken from interconnects located at the cold side. Note that the wall of the container or pipe through which the hot gas or fluid is flowing could be a part of the hot side heat exchanger 302, 403. Furthermore, as illustrated in FIG. 6, the side of a heat exchanger 302 facing the flow of hot gas or fluid 114 can have a series of bevel shapes 311 formed in it to enable better coupling of the heat from the flow 114 into the heat exchanger 302.

FIG. 6 depicts an embodiment that combines a photon enhanced TE generator with the classical TE system. The upstream elements are photon enhanced TE thermoelectric pair-PA/CG sets 608 as depicted in FIG. 3. The thermal flow 114 provides photons 602 to the PA/CG element 306 due to blackbody radiation from the temperature difference between the center of the thermal flow 114 and the boundary layer 116. As the thermal flow 114 travels downstream, the temperature difference is reduced and fewer photons are produced. Therefore, at the downstream portion of the generator, classical thermoelectric pair units 108 could be used without photon enhancement from PA/CG elements without losing a significant amount of potentially collectable energy.

Although FIG. 6 shows a heat exchanger assembly 400 that includes a photon emitter 402 whereas FIG. 5 shows a heat exchanger 302 that is transparent to at least some of the photon emitted by the thermal flow 114, either form of heat exchanger 400, 302 could be used in both embodiments represented by FIGS. 5 and 6. Also, when a heat exchanger 302 is used in any of the embodiments described in FIGS. 3-10, that heat exchanger could have lens shapes 310, bevel shapes 311 formed in it or that heat exchanger could have a nominally smooth surface on its side facing the thermal flow 114.

Multiple Thermally Isolated Heat Exchangers

Another embodiment of a photon enhanced TE generation system makes use of multiple thermally isolated heat exchangers that are located on the hot side. A different TE power generating module is coupled to each of these heat exchangers. These modules may comprise the photon enhanced TE generators of the present disclosure. Alternatively, some of these modules may comprise conventional TE generators. These TE power generating modules may be coupled to a single cold side heat exchanger or heat sink (or they may be coupled to multiple, separate cold side heat exchangers). The benefits of having thermally isolated hot side heat exchangers are discussed in an article by L. E. Bell ("Alternate thermoelectric thermodynamic cycles with improved power generation efficiencies," *Proceedings 22nd International Conference on Thermoelectrics*, pp. 558-562, 2003). This embodiment can potentially have higher thermoelectric power-generation efficiency than a system that has a single heat exchanger at its hot side that extends from inlet to outlet. Note that with this embodiment the physical wall or container through which the hot gas or fluid is flowing preferably acts as a thin thermal insulator, or at least has poor thermal conductivity in the direction of the gas or fluid flow. This maintains the desired thermal isolation between the different modules that are spaced along the length of the wall. The wall actually preferably has high thermal conductivity in the perpendicular direction, to better conduct the heat to the hot ends of the TE elements.

In the case of multiple thermally isolated heat exchangers, the temperature at the hot end of the TE elements is closer to the temperature of the hot gas or fluid, when compared to the case of a single heat exchanger. Thus, the net intensity of the incident photons is reduced. Fewer carriers would be generated by absorbing photons in the carrier generator. However, since the temperature of the carrier generator regions is higher in this case, more carriers would be thermally generated. Whether the carriers generated in the photon converter are generated thermally or by means of photon absorption, they can be injected into the N-type and P-type elements to increase the current flowing from the hot end to the cold end. Thus, there still is enhancement of the generated power.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of.

What is claimed is:

1. A system for generating power from a thermal source comprising:
   a heat exchanger element having a first side facing the thermal source and a second side opposite the first side facing the thermal source;
   a first column of thermoelectric pairs and a parallel second column of thermoelectric pairs,
      wherein each thermoelectric pair in each column comprises:
         a P-type thermoelectric element having a first end adjacent the heat exchanger element and a second end opposite the first end;
         an N-type thermoelectric element having a first end adjacent the heat exchanger element and a second end opposite the first end;
         a first conductor connected between the first end of the P-type thermoelectric element and the first end of the N-type thermoelectric element and in contact with the second side of the heat exchanger element; and
      wherein each column comprises a plurality of second conductors, each second conductor connected between the second end of the P-type thermoelectric element of one thermoelectric pair in the column and the second end of the N-type thermoelectric element of one adjacent thermoelectric pair in the column; and
   a plurality of photo converters, each photon converter coupled between the first end of one of the N-type thermoelectric elements in the first column of thermoelectric pairs and the first end of one of the P-type thermoelectric elements in the second column of thermoelectric pairs.

2. The system of claim 1, wherein each photon converter abuts the first end of one of the N-type thermoelectric elements in the first column of thermoelectric pairs and abuts the first end of one of the P-type thermoelectric elements in the second column of thermoelectric pairs.

3. The system of claim 1, wherein said at least a first of said at least one photon converter is closer to the first end of the P-type and N-type thermoelectric elements to which that photon converter is connected than to the second end of the P-type and N-type thermoelectric elements to which that photon converter is connected.

4. The system of claim 1, wherein said at least one photon converter is capable of absorbing photons and generating electrical carriers comprising holes and electrons.

5. The system of claim 4 wherein the thermal source emits photons and the at least one photon converter absorbs at least a subset of said photons emitted by the thermal source.

6. The system of claim 4 further comprising metallic photon reflectors that cover the P-type and the N-type thermoelectric elements but that do not cover at least a portion of the photon converter.

7. The system of claim 1, further comprising a photon emitter connected with the heat exchanger on the first side, said photon emitter emitting photons.

8. The system of claim 7, wherein the refractive index of the heat exchanger is greater than both the refractive index of the photon emitter and the refractive index of the photon converter.

9. The system of claim 7, wherein the refractive index of the heat exchanger is less than both the refractive index of the photon emitter and the refractive index of the photon converter.

10. The system of claim 8 wherein the heat exchanger is at least partially transparent to photons of a wavelength absorbed by the at least one photon converter.

11. The system of claim 10, wherein the heat exchanger includes a plurality of photon lenses.

12. The system of claim 7 wherein the at least one photon absorber absorbs at least some of the photons emitted by the photon emitter and generates electrical carriers comprising holes and electrons.

13. The system of claim 1, wherein the heat exchanger includes bevels on the first side, said bevels being of a shape to increase a coupling of heat from the thermal source into the heat exchanger.

14. The system of claim 2, wherein the P-type thermoelectric element comprises a material having a first electronic energy band structure, the N-type thermoelectric element comprises a material having a second electronic energy band structure and the photon converter comprises a material having a third electronic energy band structure; said first and third electronic energy band structures having a Type II band alignment.

15. The system of claim 14, wherein said second and third electronic energy band structures have a Type II band alignment.

16. The system of claim 15, wherein the first electronic energy band structure has a first conduction band edge energy, the second electronic energy band structure has a second conduction band edge energy and the third electronic energy band structure has a third conduction band edge energy, said second conduction band edge energy being lower than said third conduction band edge energy and said third conduction band edge energy being lower than said first conduction band edge energy;

and wherein the first electronic energy band structure has a first valence band edge energy, the second electronic energy band structure has a second valence band edge energy and the third electronic energy band structure has a third valence band edge energy, said first valence band edge energy being higher than said third valence band edge energy and said third valence band edge energy being higher than said second valence band edge energy;

the aforementioned alignment of the first, second and third conduction band edge energies and the aforementioned alignment of the first, second and third valence band edge energies serving to separate holes and electrons generated in the photon converter.

17. The system of claim 14, wherein the P-type thermoelectric element comprises a material having a first electronic energy band gap, the N-type thermoelectric element comprises a material having a second electronic energy band gap and the photon converter comprises a material having a third electronic energy band gap, said third electronic energy band gap being smaller than said second and first electronic energy band gaps.

18. The system of claim 1:
wherein each photon converter does not extend from the first end of any thermoelectric element to the second end of said any thermoelectric element.

* * * * *